United States Patent [19]

Shimizu et al.

[11] Patent Number: 5,033,053

[45] Date of Patent: Jul. 16, 1991

[54] SEMICONDUCTOR LASER DEVICE HAVING PLURALITY OF LAYERS FOR EMITTING LIGHTS OF DIFFERENT WAVELENGTHS AND METHOD OF DRIVING THE SAME

[75] Inventors: Akira Shimizu, Inagi; Sotomitsu Ikeda, Atsugi, both of Japan

[73] Assignee: Canon Kabushiki Kaisha, Toyko, Japan

[21] Appl. No.: 499,974

[22] Filed: Mar. 27, 1990

[30] Foreign Application Priority Data

Mar. 30, 1989 [JP] Japan .................................. 1-080879
Mar. 31, 1989 [JP] Japan .................................. 1-078177
Mar. 31, 1989 [JP] Japan .................................. 1-078716

[51] Int. Cl.$^5$ .............................................. H01S 3/19
[52] U.S. Cl. ........................................ 372/50; 372/23; 372/46
[58] Field of Search ........................ 372/50, 23, 45, 46

[56] References Cited

U.S. PATENT DOCUMENTS

| | | | |
|---|---|---|---|
| 4,740,978 | 4/1988 | Göbel et al. | 372/50 |
| 4,794,609 | 12/1988 | Hara et al. | 372/50 |
| 4,794,611 | 12/1988 | Hara et al. | 372/45 |
| 4,799,229 | 1/1989 | Miyazawa et al. | 372/50 |
| 4,817,103 | 3/1989 | Holonyak, Jr. et al. | 372/50 |
| 4,817,110 | 3/1989 | Tokuda et al. | 372/45 |
| 4,829,534 | 5/1989 | Miyazawa et al. | 372/46 |
| 4,896,328 | 1/1990 | Sekiguchi et al. | 372/45 |
| 4,930,132 | 5/1990 | Shimizu et al. | 372/22 |
| 4,993,036 | 2/1991 | Ikeda et al. | 372/50 |

FOREIGN PATENT DOCUMENTS

| | | | |
|---|---|---|---|
| 0199583 | 11/1983 | Japan | 372/50 |
| 199583 | 11/1983 | Japan . | |

OTHER PUBLICATIONS

*Journal of Applied Physics*, vol. 64(3), pp. 1022–1026, Mar. 15, 1980, "Emission Spectra of Single Quantum Well Lasers with Inhomogeneous Current Injection".

*Applied Physics Letters*, vol. 36(6), pp. 441–443, "CW Multiwavelength Transverse-Junction-Stripe Lasers Grown by Molecular Beam Epitaxy Operating Predominantly in Single-Longitudinal Modes".

*Primary Examiner*—James W. Davie
*Attorney, Agent, or Firm*—Fatzpatrick, Cella, Harper & Scinto

[57] ABSTRACT

A semiconductor laser device capable of emitting lights of different wavelengths has a substrate, a first light-emitting layer provided on the substrate, and a second light-emitting layer provided on the substrate and having a greater band gap than the first light-emitting layer. A barrier layer is disposed between the first and second light-emitting layers. The barrier layer has a band gap greater than those of the first and second light-emitting layers. The band gap and the thickness of the barrier layer are determined to be large enough to create, in response to injection of carriers to the light-emitting layers, a state in which the carrier density in the second light-emitting layer is made higher while the carrier density in the first light-emitting layer is made lower than those which would be obtained when the barrier layer is omitted. The device further has a pair of cladding layers sandwiching therebetween the first light-emitting layer, the barrier layer and the second light-emitting layer, the cladding layers having smaller refractive index values than the first and second light-emitting layers. The device further has electrodes for supplying electrical currents to the first and second light-emitting layers.

48 Claims, 13 Drawing Sheets

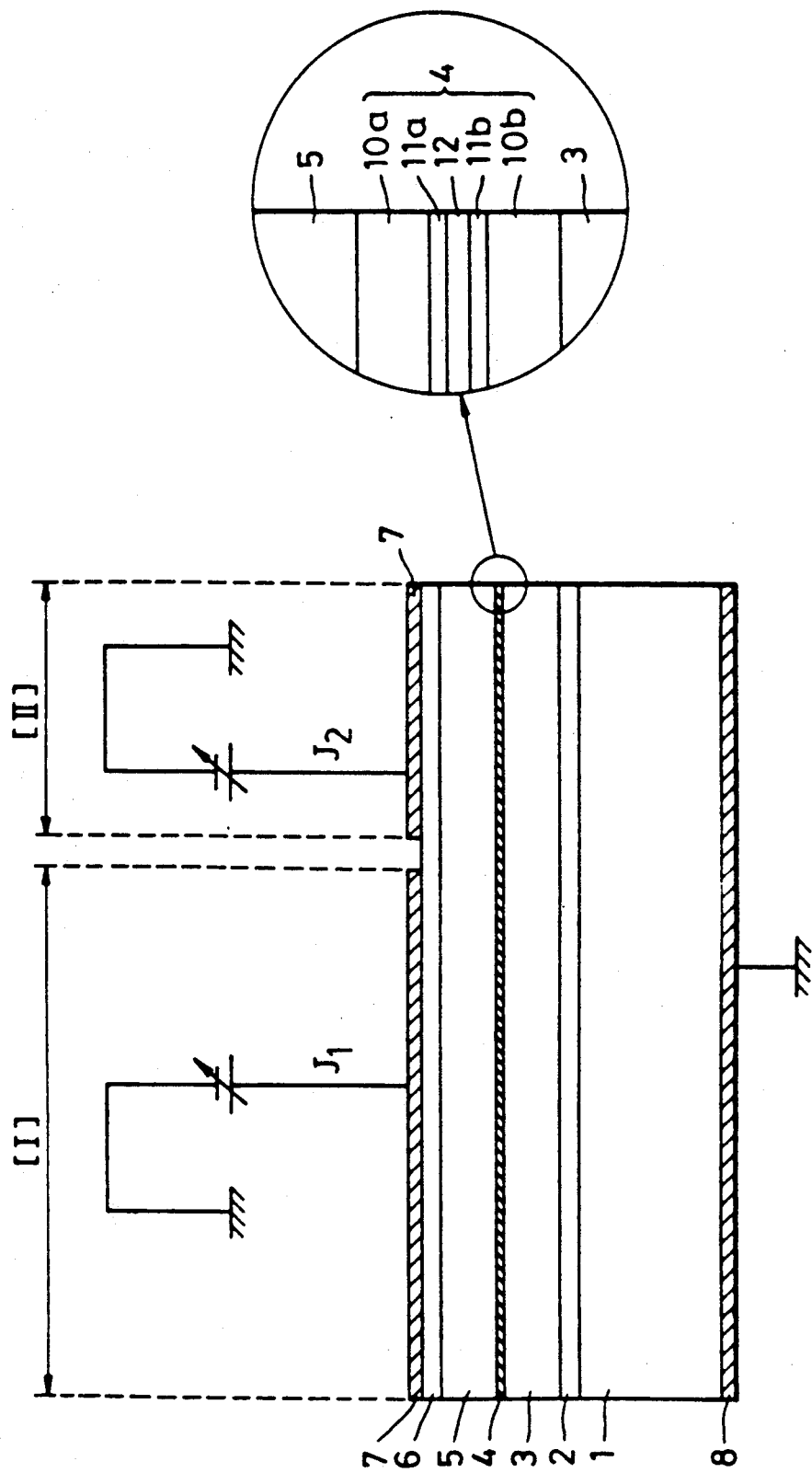

FIG. 3A
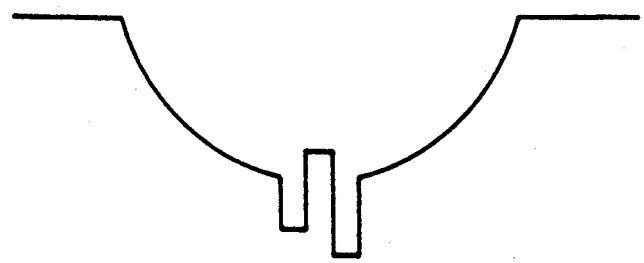
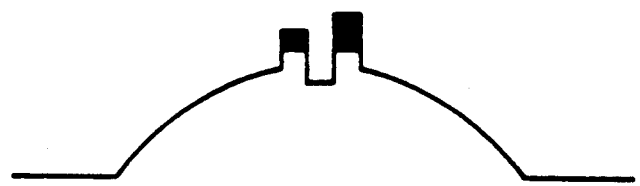
FIG. 3B
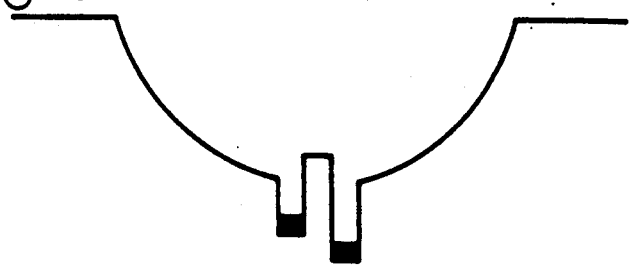
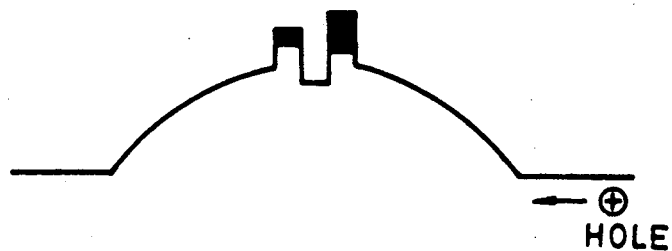

FIG. 4A
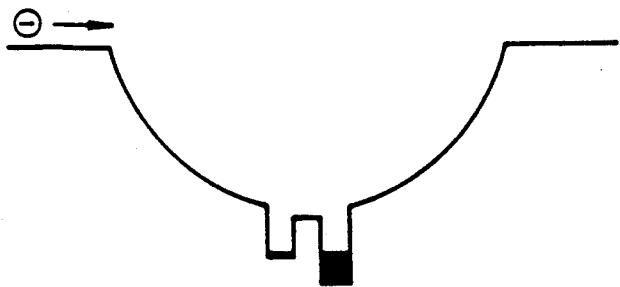
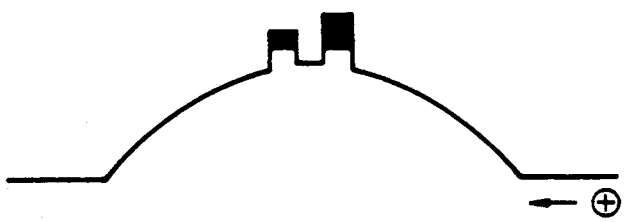
FIG. 4B
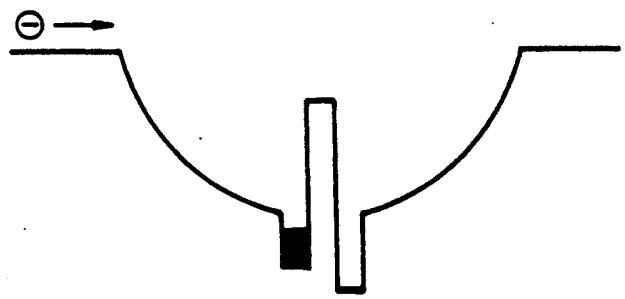
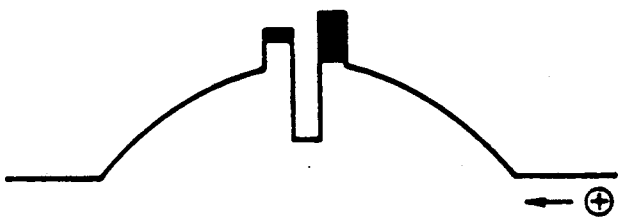

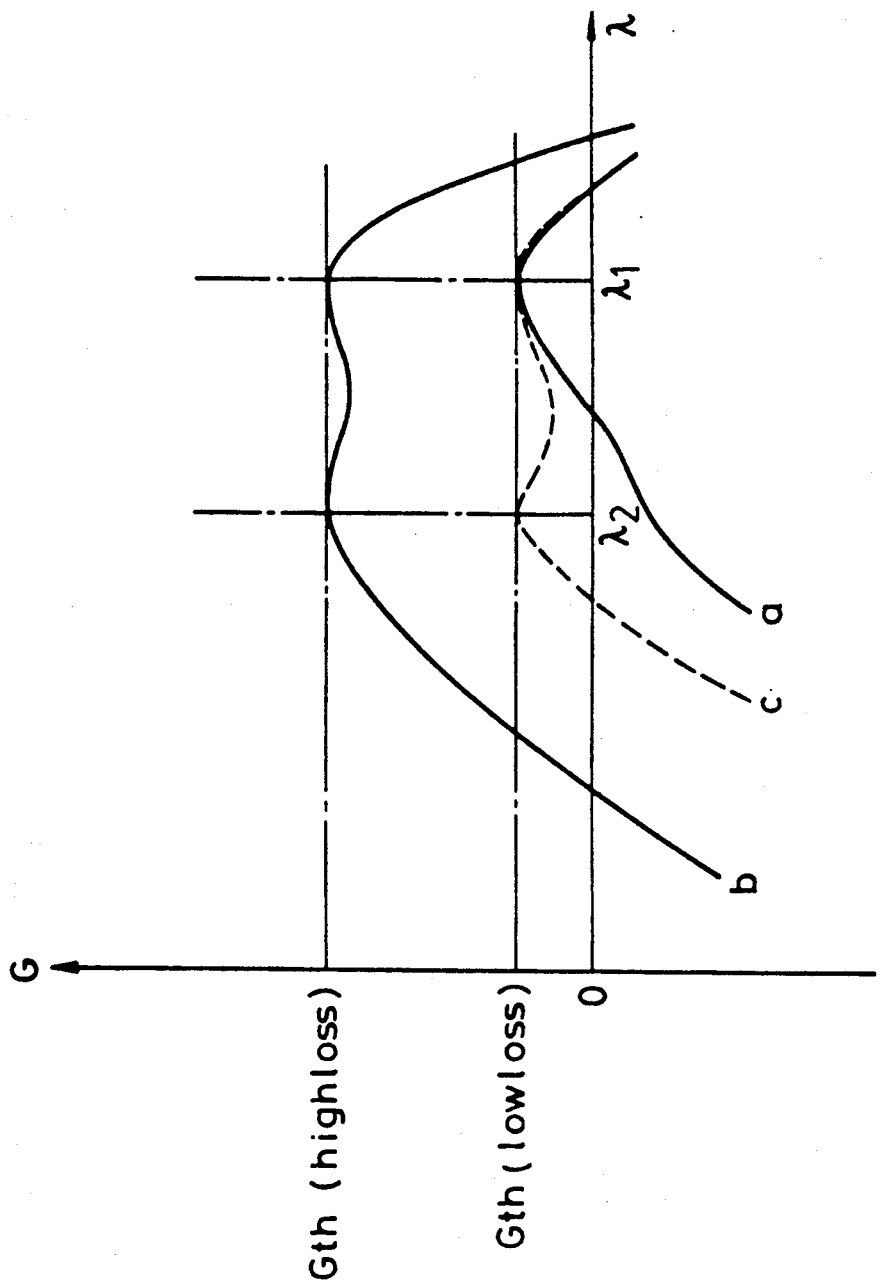

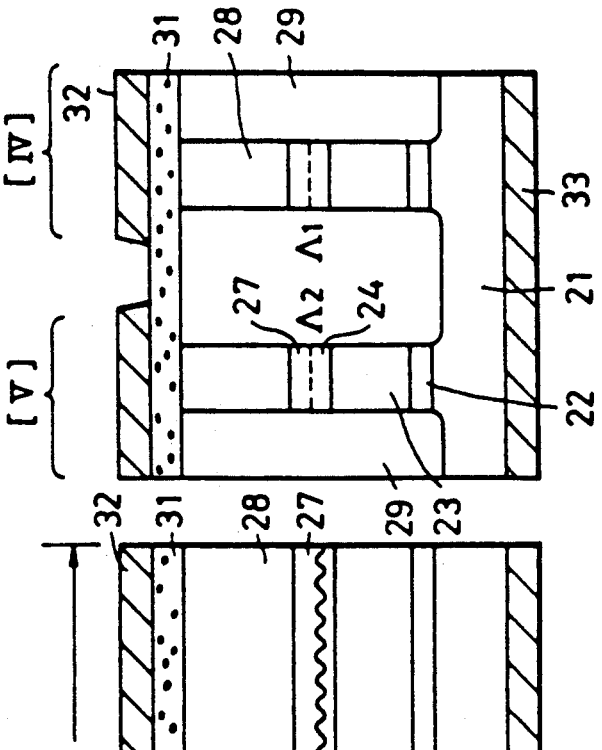
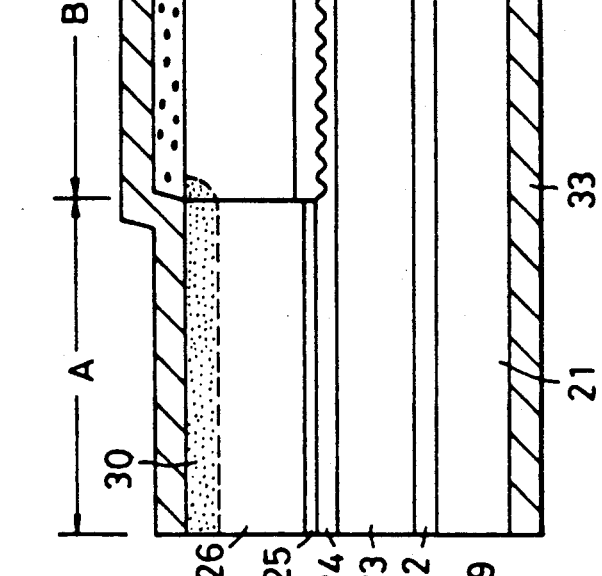
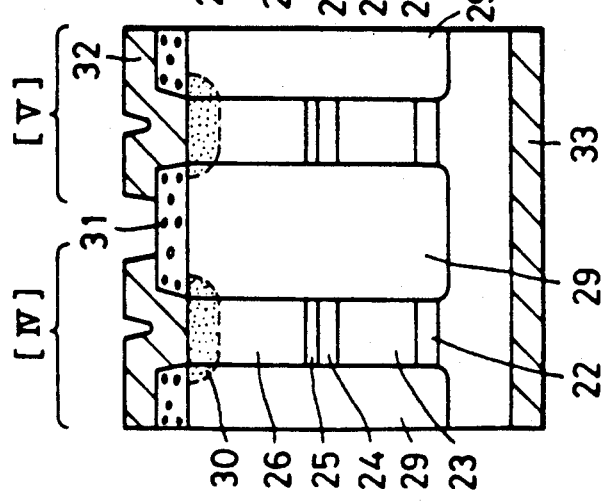

SEMICONDUCTOR LASER DEVICE HAVING PLURALITY OF LAYERS FOR EMITTING LIGHTS OF DIFFERENT WAVELENGTHS AND METHOD OF DRIVING THE SAME

BACKGROUND OF THE INVENTION

1. Field of the Invention

The present invention relates to a semiconductor laser device and a method of driving the same. More particularly, the present invention relates to a semiconductor laser device capable of emitting laser lights of different wavelengths in response to a change in the level of a driving electrical current supplied to the device, and also to a method of driving such a semiconductor laser device.

2. Description of the Related Art

In recent years, there is a rapidly increasing demand for semiconductor laser devices in the fields of optical communication and optical information processing, requiring a variety of functions to be performed by such devices. One of such needs is to provide a semiconductor laser device capable of varying emission wavelength. In a system for recording and reproducing signals to and from a medium such as an optical card or disk by means of a laser beam, it is a common measure to set the power of the reproducing beam at a level lower than that for recording, in order to prevent undesirable destruction of the recorded information by the reproducing beam. If the recording and reproduction are conducted by a single semiconductor laser device such that the wavelength of the reproducing light is set in a region where the medium is comparatively insensitive to the medium, it is possible to conduct reproduction without restricting the recorded information and without substantially reducing the reproduction output level, thus enabling a reproduction of information at a high S/N ratio.

Many proposals have been made to comply with such a requirement. For instance, Appl. Phys. Lett. Vol. 36, p. 442 (1980) proposes a semiconductor laser device of a first type in which a plurality of light-emitting layers capable of emitting laser beams of different wavelengths are formed on a single substrate but in different light waveguides, the laser being independently and selectively supplied with different levels of driving currents so that the single semiconductor laser device can emit laser beams of different wavelengths. This semiconductor laser device is therefore a combination of a plurality of independent laser devices formed on a single substrate.

A semiconductor laser device of a second type called "distributed Bragg reflection type (DBR) semiconductor laser" is also known in which a grating is used as the reflector which constitutes a resonator. This semiconductor laser device has an additional electrode provided on the grating to enable injection of carriers, i.e., supply of an electrical current. By controlling the rate of supply of the electrical current, the refraction index of the grating is changed so as to vary the emission wavelength. The construction of the light emitting layer or the like of this semiconductor laser is substantially the same as that of ordinary semiconductor lasers.

J. APPl. Phys. vol. 64, p. 1022 (1988) proposes a third type semiconductor laser device in which a single quantum well is used as an emission layer, wherein emission is made possible also from a quantum level of a higher order by increasing resonator loss, whereby laser beams of different wavelengths are obtainable at a first quantum level and a second quantum level.

The specification of U.S. Pat. No. 4,817,110 discloses a semiconductor laser device of a fourth type in which a pair of quantum wells having emission wavelengths which are not so much different from each other are used as light-emitting layers to emit laser beams of different wavelengths.

These known semiconductor laser devices have the following disadvantages.

In the semiconductor laser device of the first known type, laser beams of different wavelengths are emitted from different positions on the semiconductor laser. Therefore, when an external optical system to be combined with this semiconductor laser device is designed to focus a beam of a specific wavelength at a single fixed focal point, the laser beams of other wavelengths are fixed at points which are deviated from the above-mentioned focal point in amounts which are much greater than the slight deviation caused by wavelength dispersion. In addition, since a plurality of independent lasers are formed on the same substrate and driven independently, the production process is complicated and the size of the device is increased undesirably.

In the second known type semiconductor laser device, the wavelength is variable only in a restricted wavelength region. For instance, a laser of $Al_x Ga_{1-x}As$ type laser exhibits a very narrow wavelength region of several nm. This is because the photo-gain of the light-emitting layer can have a value large enough for emission only in such a restricted wavelength region.

The semiconductor laser device of the third known type cannot provide high laser efficiency because this type of device relies upon an increase in the loss in resonance. In consequence, emission threshold current is increased to make it impossible to obtain a large output power. Therefore, it has been impossible to conduct double-wavelength continuous emission at room temperature with this type of device.

In the semiconductor laser device of the fourth known type, the difference between two different wavelengths is very small: namely, the emission wavelength is variable only within a narrow region.

SUMMARY OF THE INVENTION

Accordingly, an object of the present invention is to provide a variable-wavelength semiconductor laser device which can vary emission wavelength over a wide range and which can operate at high efficiency, as well as a method for driving such a semiconductor laser device, thereby overcoming the above-described problems of the prior art.

To this end, according to the present invention, there is provided a semiconductor laser device comprising: a substrate; a first light-emitting layer provided on the substrate; a second light-emitting layer provided on the substrate and having a greater band gap than the first light-emitting layer; a barrier layer disposed between the first and second light-emitting layers and having a band gap greater than those of the first and second light-emitting layers, the band gap and the thickness of the barrier layer being determined to be large enough to create, in response to injection of carriers to the light-emitting layers, a state in which the carrier density in the second light-emitting layer is made higher while the carrier density in the first light-emitting layer is made lower than those which would be obtained when the barrier layer is omitted; a pair of cladding layers sandwiching therebetween the first light-emitting layer, the barrier layer and the second light-emitting layer, the cladding layers having smaller refractive index values than the first and second light-emitting layers; and an electrode means for supplying electrical currents to the first and second light-emitting layers.

This semiconductor laser device can operate as an ordinary laser diode which emits light when a current is supplied to the level of a threshold value, and also as a laser amplifier. Namely, the device can operate as a laser amplifier when driven by a method comprising: injecting an electrical current to the light-emitting layers through the electrode means at a current value slightly smaller than the laser emission threshold current; causing an external light of a wavelength near the laser emission wavelength to be incident to the device; and picking up from the device a light having the same wavelength as the incident light.

The semiconductor laser device can also be used as a wavelength converter. In this case, the driving method is such that an electrical current slightly smaller than the laser emission threshold current is supplied to the light-emitting layers through the electrode means, and an external light having a photon energy level greater than the band gaps of the first and second light-emitting layers is made incident to the device, and then a light having a wavelength different from that of the incident light is taken out of the device.

The term "band gap" is used in connection with a quantum well in the specification means the minimum transition energy for transition from valence band to conduction band including quantization energy.

The present invention can overcome all the aforementioned problems of the known arts.

The light-emitting layers of different emission wavelengths are provided in a single light waveguide so that the position from which the laser beam is emitted does not change when the emission wavelength is changed. In addition, it is not necessary to provide independent current injection means for different wavelengths, so that the device can be fabricated without difficulty and without substantially increasing the size of the device as compared with the known device. It is thus possible to overcome the problems encountered with the semiconductor laser device of the first known type.

The problems encountered with the semiconductor laser device of the second known type also is overcome by the present invention in which different light-emitting layers, arranged in a single light waveguide, are used for emitting laser beams of different wavelengths to provide a wide range of variation of wavelength. For instance, when $Al_xGa_{1-x}As$ is used as the material of the light-emitting layers, it is possible to vary the emission wavelength over a wide range of from several tens to several hundreds of nm.

The problems encountered with the semiconductor laser device of the third known type also is eliminated as follows. The semiconductor laser device of the invention has a barrier layer disposed between two adjacent light-emitting layers of different emission wavelengths. The barrier layer has a band gap grater than those of the light-emitting layers. The band gap and the thickness of the barrier layer are so determined that, when carriers are injected to the light-emitting layers, the carrier density is increased and decreased in the light-emitting layer having the greater band gap and in the light-emitting layer having the smaller band gap, respectively, as compared with the case when the barrier is omitted. According to this arrangement, the gain distribution is expanded towards the short wavelength side, as compared with the known device supplied with carriers at the same rate. It is therefore possible to emit laser beams of different wavelengths without injecting large currents, i.e., without requiring the resonator loss to be increased.

It has also been found that the efficiency of the laser device of the invention can be further improved when the barrier layer and, as required, the light-emitting layers are doped to p- or n-type. More specifically, the doping is preferably affected in the same polarity as that of the carriers, i.e., electrons or holes, which, when the electrons and holes are injected through opposing cladding layers, encounter greater resistance in reaching the light-emitting layer adjacent to the opposite cladding layer. Namely, it is preferred to add through doping one of two types of carriers which encounters with greater resistance than the other.

By virtue of the described features, the semiconductor laser device of the present invention can operate at much higher efficiency than known lasers, while the emission threshold current is substantially the same as or about twice as large at the greatest that of ordinary semiconductor lasers of fixed-wavelength type. In addition, continuous emission at room temperature, which could not be performed by known variable-wavelength lasers having large wavelength range can be conducted without difficulty by the semiconductor laser device of the present invention.

It will be clear also that the above-described features overcome the problem encountered with the semiconductor laser device of the fourth known type, because it is easy to construct the semiconductor laser device such as to widen the range of wavelength emitted by different emitting layers.

It is to be noted, however, that widening of the difference in wavelengths alone poses the same problem as that encountered with the known device proposed in J. APPl. Phys. vol. 64, p. 1022 (1988), because emission at small wavelength requires injection of current at a large rate. The variable-wavelength semiconductor laser device of the present invention, which has a wide range of emission wavelength and which operated at high efficiency, is obtained not only by enlarging the wavelength difference but also by a delicate control of flow of carriers through careful determination of factor values such as band gap and thickness of the barrier layer, doping in a specific polarity and so forth.

The significance of such delicate control will be more fully understood from the following description of the embodiments. The following embodiments are assumed to have two different wavelengths, for the purpose of simplification of explanation. However, it will be clear to those skilled in the art that the semiconductor laser device of the invention can have three or more emission wavelengths, without substantial difficulty change from those having two emission wavelengths.

BRIEF DESCRIPTION OF THE DRAWINGS

FIGS. 1A and 1B are a side elevational view and a front elevational sectional view of a first embodiment of the semiconductor laser device in accordance with the present invention;

FIGS. 3A and 3B are schematic illustrations of carrier distribution in a semiconductor laser device of the present invention;

FIGS. 4A and 4B are schematic illustrations of carrier distribution as observed when the conditions of the present invention are not met;

FIG. 5 is an illustration of distribution of effective photo-gain;

FIGS. 9A, 9B and 9C are schematic sectional views of a fourth embodiment of the semiconductor laser device of the present invention;

DESCRIPTION OF THE PREFERRED EMBODIMENTS

Figure 1B:
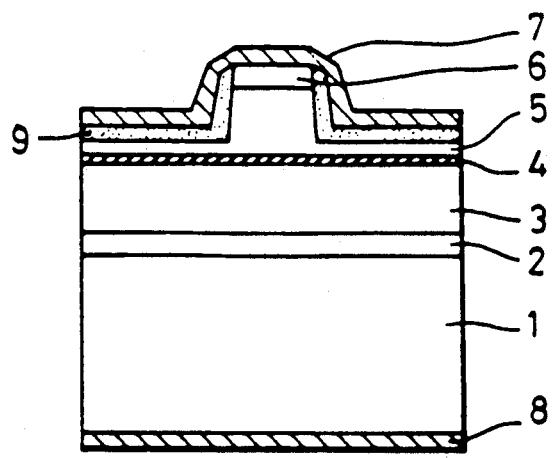

FIGS. 1A and 1B are a sectional side elevational view and a sectional front elevational view of a first embodiment of the semiconductor laser device of the present invention.

This semiconductor device can be produced by, for example, molecular beam epitaxial (MBE) method or metal-organic chemical vapor deposition (MOCVD) which are used in the production of ordinary semiconductor lasers. The production process, therefore, is not described in detail.

As will be seen from FIGS. 1A and 1B, the first embodiment of the semiconductor laser device has a substrate 1 made of n+-GaAs, a buffer layer 2 made of n+-GaAs, a cladding layer 3 of n-$Al_{xc}Ga_{1-xc}As$, a light waveguide portion 4, a cladding layer of p-$Al_{xc}Ga_{1-xc}As$, a cap layer 6 of p+-GaAs, an electrode 7 of Au/Cr and another electrode 8 o Au-Ge/Au.

Referring specifically to FIG. 9, a ridge-type waveguide portion is formed by, for example, etching with reactive ion beam, so as to restrict current and light to stripe-shaped regions. An $Si_3N_4$ film 9 formed by plasma CVD process is removed is etched at the top portion of the ridge, and the electrode 7 is formed on the $Si_3N_4$ film by evaporation deposition.

As means for enabling change of emission wavelength, the electrode 7 is split into two portions which can be supplied with electrical current independently. These two portions enable control of densities $J_1$, $J_2$ of electrical currents flowing in an active region [I] and a loss region [II].

Figure 2:
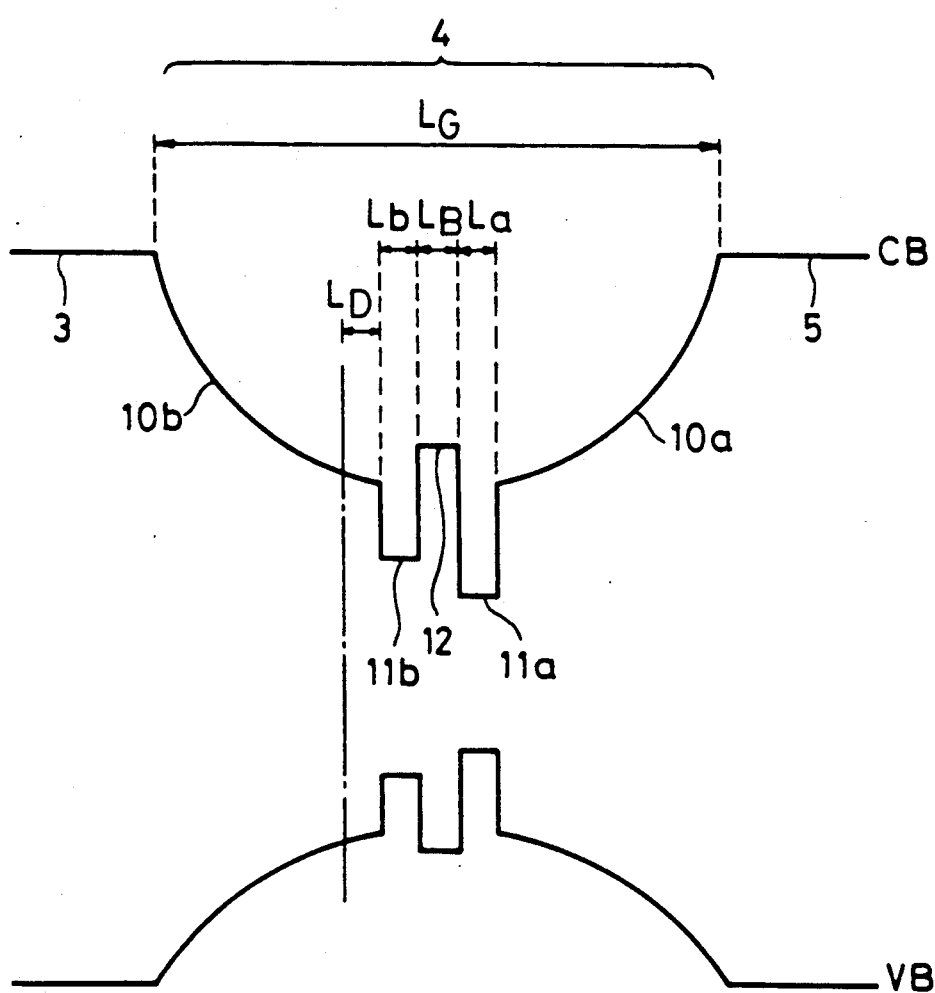
FIG. 2 is a diagrammatic illustration of a band in a light waveguide portion in the first embodiment.

The detail of the construction of the light waveguide portion 4 is shown in a circle appearing on a right-side portion of FIG. 1A, while the band of the light waveguide portion 4 is shown in FIG. 2. Numeral 10a and 10b denote separate confinement (SC) layers of $Al_{xc}Ga_{1-xc}$-As of p- and n-types, respectively. Numerals 11a and 11b denote light-emitting layers of $Al_{xa}Ga_{1-x_a}As$ and $Al_{xb}Ga_{1-xb}As$, respectively. Numeral 12 denotes a barrier layer of p+-$Al_{xB}G_{1-xB}As$.

The use of SC type structure is not critical to the invention. The SC-type structure, however, is specifically effective and, hence, preferred to improve carrier injection efficiency and to obtain a good light intensity distribution, considering that the light-emitting layers are arranged in an asymmetrical manner.

In the illustrated embodiment, a light-emitting layer 11a capable of emitting a laser beam of a long wavelength ($\lambda_1$) is disposed adjacent to the p-type cladding layer 5. Therefore, holes which are injected through the cladding layer 5 and flowing towards the light-emitting layer 11b for emitting a laser beam of a shorter wavelength ($\lambda_1$) encounters with a greater resistance than when flowing in the counter direction. Therefore, the barrier layer 12 is beforehand doped in p-type at a high density so as to beforehand add holes. In addition, a portion of the n-type SC layer 10b adjacent to the light-emitting layer, having a thickness $L_D$ shown in FIG. 2, also has been doped to p type so as to further increase the hole supplying efficiency. In this case, the thickness $L_D$ has to be determined to be smaller than the length of diffusion of the carriers, i.e., electrons in this case, which are injected from the same side as the SC layer 10b.

Since holes are supplied beforehand in a sufficiently large quantity, holes are distributed in both light-emitting layers in a manner shown in FIG. 3A when no electrical current is supplied. In such a case, the operation of the laser may be discussed mainly in relation to the distribution of electrons. The following description is therefore based upon this condition. The following description, however, obviously suggests the operation in the contrary case, i.e., when the p and n types are replaced by each other in the illustrated embodiment.

One of the critical features of the present invention resides in that the thickness and the potential level of the barrier layer are selected to be large enough to provide such carrier distributions in the light-emitting layers as shown in FIG. 3B when a current of a value approximating that of the laser emission threshold current is supplied to the device. When the barrier layer is too thin or to low, the carrier distribution is substantially the same as that obtained when there is no barrier, as shown in FIG. 4A. Thus, according to the invention, the thickness and the potential level of the barrier layer are so selected that the proportion of electrons in the light-emitting layer for shorter wavelength becomes greater than that in FIG. 4A. A too large thickness or a too high potential level of the barrier layer, however, impedes the movement of electrons to the light-emitting layer for longer wavelength. It is therefore important that the thickness and the potential level are determined to realize a state intermediate between the states shown in FIG. 4A and 4B. This critical condition can be expressed by the following formula:

$$\Gamma_1(\lambda_1)g1\,(\lambda_1,\,n_1,\,p_1) \approx \Gamma_2(\lambda_2)g2\,(\lambda_2,\,n_2,\,p_2)$$

where, $n_1$ and $n_2$ represent electron densities in the light emitting layers, $p_1$, $p_2$ represent the hole densities in the light-emitting layers, $g1(\lambda_1, n_1, p_1)$ and $g2(\lambda_2, n_2, p_2)$ represent the photo-gains at the respective emission wavelengths $\lambda_1$ and $\lambda_2$, and $\Gamma_1(\lambda_1)$ and $\Gamma_2(\lambda_2)$ represent the light confinement coefficients, respectively.

Thus, according to the invention, the thickness and the potential level of the barrier layer are so selected that the condition of the formula shown above is satisfied when the laser device is supplied with a current of a value substantially the same as the emission threshold current of an ordinary laser having no shorter-wavelength light-emitting layer and, hence, no barrier layer.

Two design methods are available for producing such a semiconductor laser device. One of these methods is a theoretical design method which employs a theory describing the gain of the laser and the dynamics of the carrier. Theoretical formulae shown in "Semiconductor Laser and Photo-Integrated circuits" (written and edited by Suematsu, published from Ohm-sha, 1984) may be used as the theoretical descriptions for the design.

The other method is a method which employs models of devices having different designs of the barrier layer. Natural emission spectrums of such models are measured and the optimum barrier layer design is predicted from the results of measurement. Namely, the condition shown in FIG. 4A is considered to be established in a model which exhibits higher intensities in the long-wavelength portion of the spectrum, whereas a model which exhibits higher intensities in short-wavelength portion of the spectrum is considered to be in the condition shown in FIG. 4B. The design of the model which exhibits spectral distribution intermediate between the above-mentioned two models is therefore considered as being optimum.

A description will now given of the reasons why the laser in accordance with the invention having the carrier distribution as shown in FIG. 3B can emit a plurality of lights of different wavelengths at high efficiency.

FIG. 5 schematically shows the level of the effective photo-gain $G(\lambda)$ of a laser in relation to wavelength, as observed when carriers are injected in an amount large enough to enable the laser to emit a light. The effective photo-gain $G(\lambda)$ is the product of the photo-gain and the confinement coefficient. Thus, in case of the laser in accordance with the present invention, the effective photo-gain $G(\lambda)$ is expressed by $G(\lambda) = \Gamma_1(\lambda) g1(\lambda, n_1, p_1) + \Gamma_2(\lambda) g2(\lambda, n_2, p_2)$.

More specifically, a curve (a) in FIG. 5 shows the effective gain-wavelength characteristic as obtained in an ordinary single quantum well (SQW) laser or a multi-quantum well (MQW) laser having a small resonator loss.

A curve (b) shows the effective gain-wavelength characteristics observed in a conventional laser 3 which is an SQW laser having a large resonator loss.

A curve (c) represents the effective gain-wavelength characteristic in an asymmetrical double quantum well (ADQW) laser having a small resonator loss as used in the present invention.

Referring first to the characteristic shown by the (a), a gain Gth (low loss) which balances the resonator loss is obtained at the wavelength $\lambda_1$ so that a light of a wavelength $\lambda_1$ is omitted. The light of a wavelength $\lambda_2$ is not emitted because the gain at this wavelength is below the level of Gth (low loss).

Referring now to the characteristic shown by the curve (b), the resonator loss is large so that the gain Gth (high loss) necessary for emission is also large. In order to obtain this gain, it is necessary to inject a large quantity of carriers. The carrier distribution is therefore elongated in the high-energy side so that the gain can reach the levels Gth (high loss) even at the smaller wavelength $\lambda_2$. In this case, therefore, a gain approximating Gth (high loss) can be obtained at both wavelengths $\lambda_1$ and $\lambda_2$. Under such a condition, it is possible to shift the emission wavelength by slightly changing the effective gain-wavelength characteristic of the effective gain of the whole laser. As explained before, however, the necessity for a large quantity of carriers to be injected means that a large current has to be supplied. Thus, the efficiency of the laser is extremely low.

It is to be pointed out here that, both in the characteristics shown by the curves (a) and (b), the distribution of the carrier energy in each light-emitting layer is approximated by a state in which electrons and holes are distributed in accordance with the Fermi distribution which is determined by quasi-Fermi level. The reason is that, as known to those skilled in the art, the time required for transition of carriers in a band and between the sub-bands, which is about 0.1 to 10 psec in case of GaAs, is shorter than the tie constant of light-emitting re-coupling which is about 10 nsec in case of GaAs, so that chances are given to the electrons to collide with other electrons, as well as to the carriers to collide with other carriers, thus establishing a thermally sub-equilibrium state. For the details, a reference be made to "Semiconductor Laser and Photo-Integrated Circuit", written and edited by Suematsu, published from Ohm-sha, 1984.

In the conventional MQW lasers, in order to allow a uniform injection of carriers to all light-emitting layers, the potential level and the thickness of the barrier layer between the light-emitting layers are made as small as possible without causing the effect of quantization to be impaired, so that all the light-emitting layers can exhibit carrier distributions as that obtained when there is no such a barrier layer.

Under the conditions where the electrons and holes are uniformly injected and distributed in accordance with Fermi distribution determined by quasi-Fermi level, the only way for obtaining a substantially equal gain at two different wavelengths spaced apart is to raise the quasi-Fermi level (to lower the quasi-Fermi level in case of holes). This means that a large quantity of carriers has to be injected. Hitherto, therefore, a variable-wavelength laser could be obtained only through increasing the resonator loss by setting a large resonator loss as in the semiconductor laser device of the third known type or through setting a very narrow wavelength region over which the wavelength is variable as in the cases of the semiconductor laser devices of the second and fourth known types.

In contrast, in the semiconductor laser device of the invention which exhibits the effective gain-wavelength characteristic as shown by the curve (c) in FIG. 5, carriers are adequately distributed to two different light-emitting layers as shown in FIG. 3B so that the effective gain $G(\lambda)$ can reach a level approximating that of Gth (high loss) at two different wavelengths $\lambda_1$ and $\lambda_2$. For information, the conditions shown in FIGS. 4A and 4B undesirably provide characteristics shown by the curve (a) in FIG. 5 as in the case of the known arrangement. The wavelength distribution as shown by the curve (c), once it is obtained, can easily provide a variable-wavelength laser with the aid of a suitable means for varying the emission wavelength. Various means or methods are available for affecting such a change in the emission wavelength.

The most feasible method is to change the emission wavelength by causing a slight change in the effective gain-wavelength characteristic by a non-uniform injection as in the case of the semiconductor laser device of the third known type. Namely, it is possible to change the emission wavelength by charging electrical currents to both electrodes shown in FIG. 1A at different current densities $J_1$ and $J_2$ and varying the ratio between these current densities and the levels of these current densities.

Figure 6:
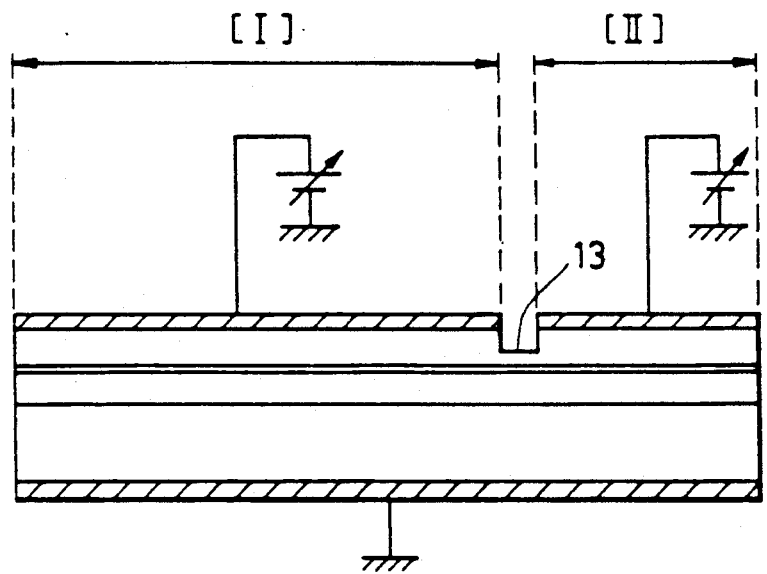
FIGS. 6 and 7 are sectional side elevational views of second and third embodiments of the semiconductor laser device of the present invention.

FIG. 6 is a sectional side elevational view of a second embodiment of the present invention. This second embodiment is discriminated from the first embodiment only in that a groove 13 reaching the upper cladding layer is provided at the boundary between the active region [I] and the loss region [II]. This groove 13 provides an electrical isolation between both regions, thus attaining a further improvement in the controllability.

Figure 7:
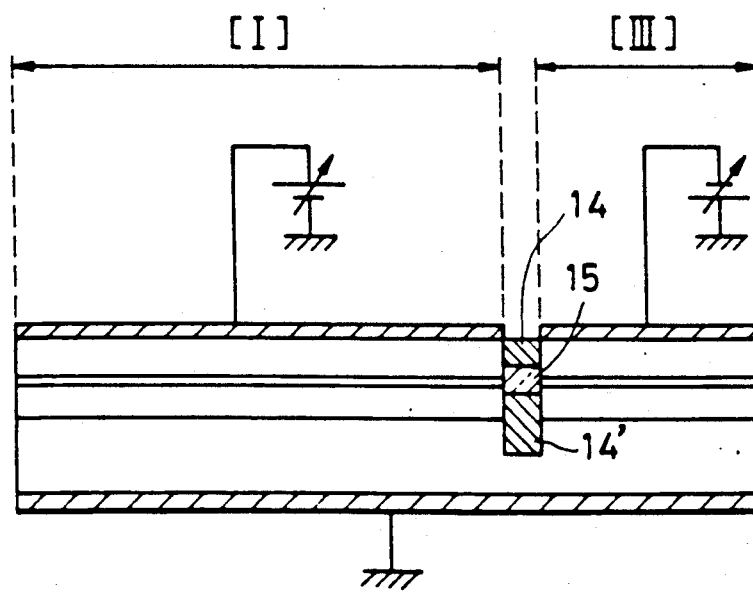

FIG. 7 is a sectional side elevational view of a third embodiment which is similar to the first embodiment in that the electrode is divided into two parts in the direction of the resonance. In this embodiment, however, an inverse bias voltage is applied to one of these two regions so as to form an absorption region [III].

When an inverse bias voltage is applied to the absorption region [III], the end of the absorption range under application of a voltage for shifting the peak of absorption of excitons confined in the quantum well in the active region is shifted to the longer-wavelength side so that the internal loss for long-wavelength lights is increased to allow an emission at the lower wavelength.

The third embodiment further has a groove formed at the boundary between the regions [I] and [III] and reaching the substrate. In this groove are embedded claddinq layers 14, 14' and a light waveguide layer 15 sandwiched between the cladding layers 14, 14' which are formed by liquid-phase epitaxial method.

Another method for varying the emission wavelength is to control the emission wavelength by varying the electrical current, without dividing the electrode, i.e., by means of a single electrode. It was confirmed that, when such a control method is used, the emission takes place first at the longer wavelength and then at the shorter wavelength. There are two modes: namely, a first mode (i) in which a further increase of the electrical current causes the emission at the longer wavelength to terminate and a second mode (ii) in which the emission at the longer wavelength is continued.

It was confirmed that the first mode (i) is obtained when the light-emitting layers and the barrier layer are set to meet the condition of $g1(\lambda_2, n_1, p_1) > 0$, while the second mode (ii) is obtained when the light-emitting layers and the barrier layer are set to meet the condition of $g1(\lambda_2, n_1, p_1) \leq 0$. The first mode (i) has a wide applicability because it enables a discrete switching of the emission wavelength.

Although not specifically mentioned in the description of the embodiments, the well layers in an ADQW as that of the invention may have different thicknesses. An example of such an arrangement is shown in FIG. 8.

Figure 8:
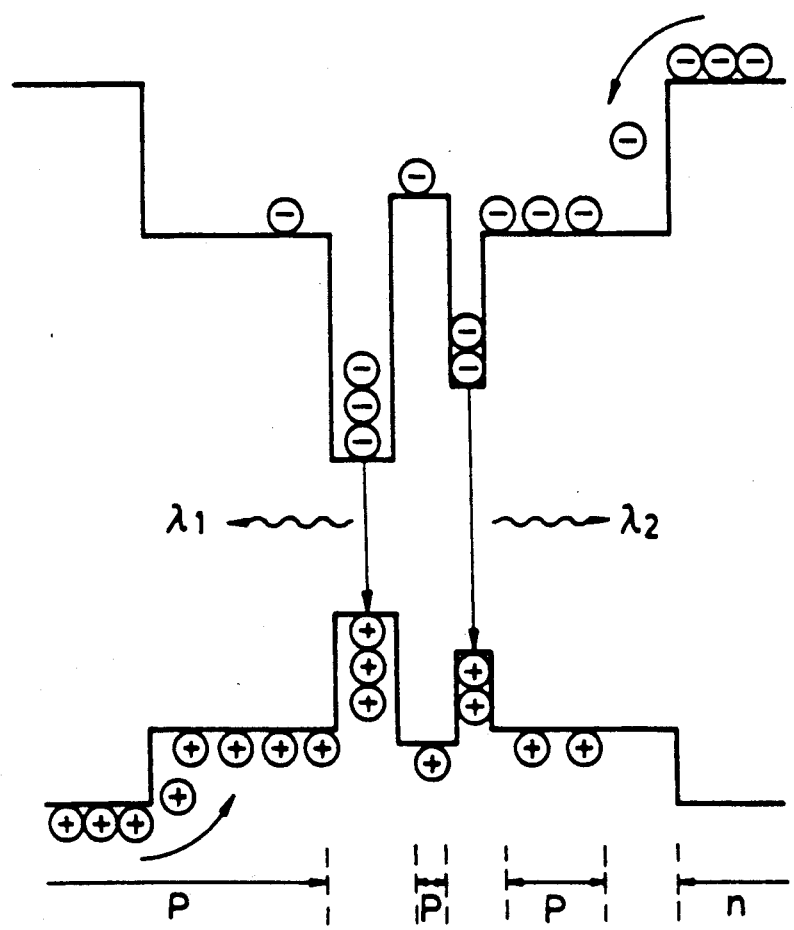
FIG. 8 is an illustration of band in a device of the invention having a modified well structure.

In FIG. 8, a light waveguide structure has a plurality of quantum well layers having different energy gaps and a confining layer confining light and electrons. The well layer having a greater energy gap has a smaller thickness of layer than the well layer of a smaller energy gap. In this Figure, the thickness of the well layer is represented by the breadth of the well. In addition, the active layer is doped to p-type.

The control of the emission wavelength is affected either by varying the loss in the resonator or by forming a reflector having a wavelength selectivity. By such a method, it is possible to cause emission at wavelengths corresponding to the energy gaps.

The loss in the resonator is broadly sorted into two types: namely, an internal loss which are mainly a loss caused by absorption of free carriers or scattering and a loss produced at end surfaces. The change in the internal loss can be affected by various methods such as a change in the breadth of a resonator, diffusion of impurities, ion bombardment and proton irradiation. On the other hand, the change in the end surfaces is caused by changing the ratio of the end surface loss to the total loss through varying the length of the resonator or by controlling the reflectivity by coating the end surfaces of the resonator.

On the other hand, the reflector having a wavelength selectivity can effectively be realized by forming diffraction gratings in the waveguide path as in the case of distributed Bragg reflection (DBR) -type reflector or distributed feedback (DFB) -type reflector. It is also effective to use an external resonance type reflector having external diffraction gratings. The coating of the resonator end surfaces mentioned above as the measure for changing the end surface loss is to make use of the wavelength selectivity when the change in the reflectivity has a large dependency on the wavelength.

A description will be given of the condition for forming the diffraction grating in the DFB- or DBR-type reflector having internal diffraction gratings.

The diffraction gratings are formed on a light waveguide layer which is optically coupled to the active layer. The pitches $\Lambda_i$ of the gratings are provided by the following formula:

$$\Lambda_i = l \cdot \lambda_i / 2n_{eff(i)} \tag{1}$$

where $\lambda_i$ represent the wavelength at which the emission is to take place, l represents the number of order of diffraction (an integer), $n_{eff}$ represents the equivalent refractive index and i is a suffix for identifying each laser unit. These diffraction gratings are capable of stably causing emission of lights at the respective wavelengths $\lambda_i$.

It is thus possible to effect a stable emission of a desired number of lights at desired wavelengths and wavelength spacing, by varying the pitch of the diffraction gratings.

Embodiment 1

FIGS. 9A to 9C are schematic sectional views of a critical portion of a double-wavelength semiconductor laser device embodying the present invention and incorporating a distribution Bragg reflection (DBR) type laser. More specifically, FIG. 9A is a sectional view of an active region, FIG. 9B is a sectional view taken in the direction of resonance and FIG. 9C is a sectional view of the DBR region.

Referring to FIG. 9B, the double-wavelength semiconductor laser device has an active region A of 300 μm long and a DBR region B of 800 μm long. The active region A has the following layers formed by molecular beam epitaxial process on an n+-GaAs substrate 21 through the intermediary of an n+-GaAs buffer layer 22 of 0.5 μm thick: n-$Al_{0.5}Ga_{0.5}As$ cladding layer 23 (1.5 μm thick); an n-$Al_{0.5}Ga_{0.6}As$ light waveguide layer 24 (0.2 μm) thick); an active layer 25 (0.1 μm thick); and a p-$Al_{0.5}Ga_{0.5}As$ cladding layer 26 (2.0 μm thick). After forming diffraction gratings, a mesa process is conducted for contracting electrical current to form an embedded structure with a current contraction layer 29 of n-$Al_{0.5}Ga_{0.5}As$. As a result of formation of the embedded structure, the light waveguide path has a width of 1 to 2 $\mu m$.

Figure 10:
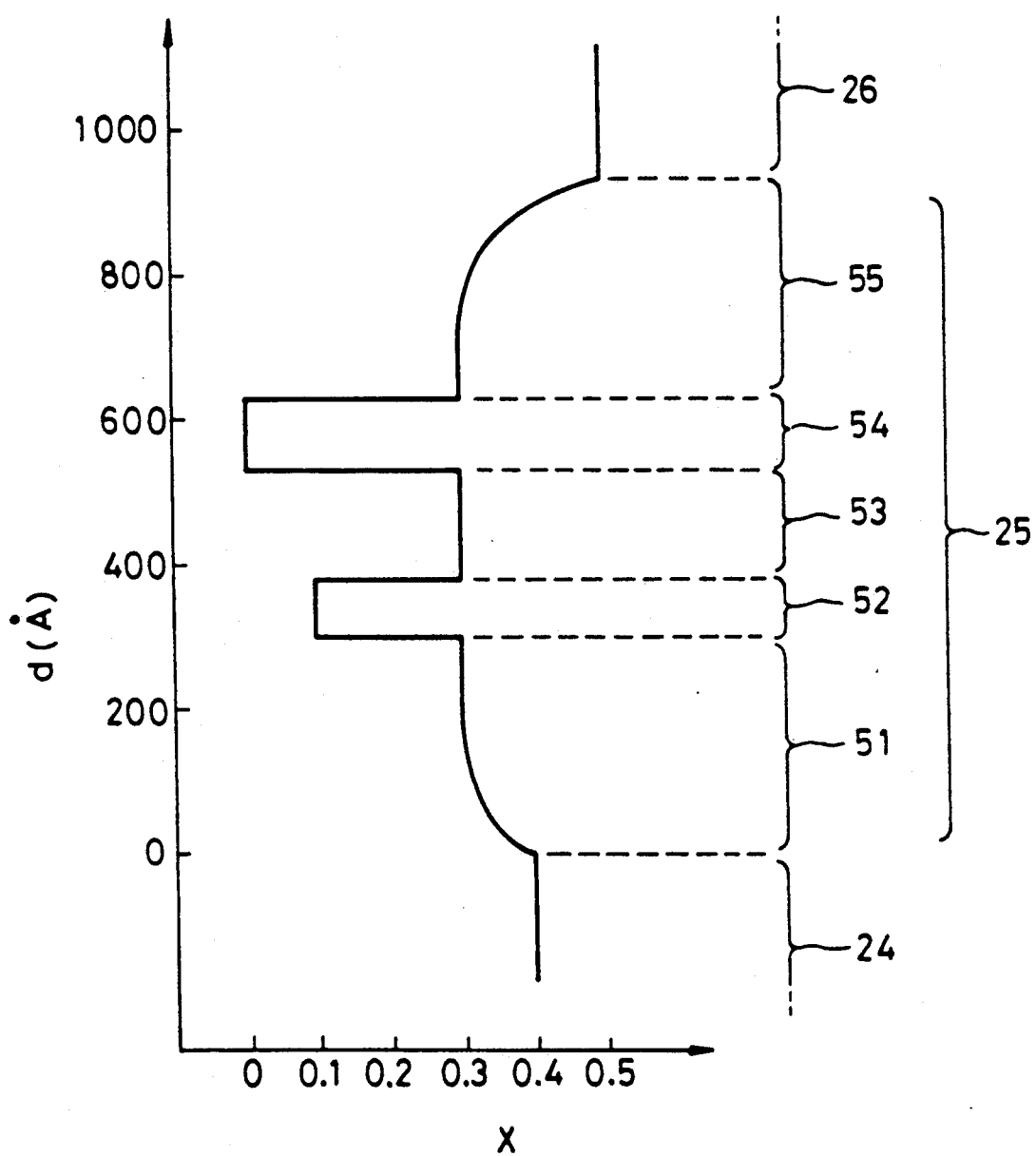
FIG. 10 is an illustration of a band in a light waveguide portion in the fourth embodiment.

Referring now to FIG. 10, the active layer 25 has a first SC layer 51 of 300 Å the composition of which progressively changes from $Al_{0.4}Ga_{0.6}As$ to $Al_{0.3}Ga_{0.7}As$ from the end closer to the substrate towards the other end; a first well layer 52 of $Al_{0.1}Ga_{0.9}As$ having a thickness of 80 Å, a barrier layer 53 of p-$Al_{0.3}Ga_{0.7}As$ having a thickness of 150 Å, a second well layer 54 of GaAs having a thickness of 100 Å, and a second SC layer 55 the composition of which progressively changes from p-$Al_{0.3}Ga_{0.7}As$ to p-$Al_{0.5}Ga_{0.5}As$ and which has a thickness of 300 Å. The first well layer and the second well layer respectively have energy gaps of 1.68 eV and 1.55 eV, respectively. The emission wavelengths at room temperature are 800 nm and 860 nm, respectively.

In general, when the barrier layer has a thickness of about 100 Å or so, mutual interference between the electron levels of both wells is avoided so that carriers can be charged independently to these wells so as to enable emission from these wells independently of each other.

In this embodiment, the second SC layer 55 and the barrier layer 53 are doped with acceptor impurities so that these layers form p-type region. This doping is conducted for the purpose of enhancing re-coupling efficiency, in view of the fact that the mobility of carriers is about one order of magnitude smaller than that of electrons.

The progressive change in compositions of the SC layers are effective for injection of electrons.

Selective emission of the lights generated in two wells can be conducted by controlling the propagation constant of the diffraction gratings, i.e., the structure of the light waveguide portion and the grating pitch of the diffraction gratings.

Referring to FIG. 9B, the DBR region B after the formation of layers is cut by wet etching down to the level of the light waveguide layer 24 so as to form a flat layer. The diffraction gratings are formed by double-beam interference exposure technique. The diffraction gratings formed on the regions [IV] and [V] have different periods. More specifically, the pitches of the diffraction gratings are determined such as to provide the maximum reflectivity values at wavelengths 800 nm and 860 nm, respectively, where the first and the second well layers exhibit large gains.

In this embodiment, if diffraction of the second order is to be used, diffraction gratings having pitches of $\Lambda_1 = 2382$ Å and $\Lambda_2 = 2591$ Å are respectively formed in the regions [IV] and [V].

The diffraction gratings in the regions [IV] and [V] are formed independently by a process including a photolithographic step and an etching step, so that the reflector is formed with the above-mentioned pitches of diffraction gratings. After the formation of the diffraction gratings, an i-$Al_{0.3}Ga_{0.7}As$ light waveguide layer 27 of about 0.1 $\mu m$ thick and an n-$Al_{0.5}Ga_{0.5}As$ cladding layer 28 of about 2.0 $\mu m$ thick are formed by liquid-phase epitaxial method. In order to form the light waveguide path, the DBR region B is then subjected to mesa processing simultaneously with the active region A and then the embedded layer 29 of n-$Al_{0.5}Ga_{0.5}As$ is formed by liquid-phase epitaxial method.

The formation of the current injection window is conducted as follows. Namely, an insulating layer 31 of $SiO_2$ or $Si_3N_4$ and having a thickness of 0.5 $\mu m$ is formed by plasma CVD and then an injection window of 2 $\mu m$ wide is formed in the active layer within the active region A. Then, using $ZnAs_2$ for obtaining ohmic contact, Zn is diffused by a quartz tube method so as to form a Zn diffused region 30. Then, after evaporation deposition of Au/Cr p-type electrode 32, the electrode 32 is divided into portions belonging to the regions [IV] and [V]. Finally, an n-type electrode 33 of Au-Ge/Au is formed by evaporation deposition.

According to this embodiment, the light generated in the active region A is reflected by the DBR region B. More specifically, in the regions [IV] and [V], lights of wavelengths $\lambda_1$ and $\lambda_2$ are selectively reflected by the diffraction gratings having grating pitches $\Lambda_1$ and $\Lambda_2$. It is thus possible to emit lights at two different wavelengths with a single active layer.

Figure 11A:
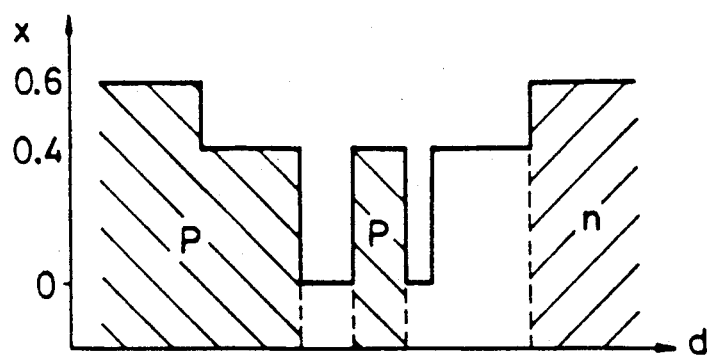
FIGS. 11A, 11B, 11C and 11D are illustrations of bands in modifications of well structure in the fourth embodiment.
Figure 11B:
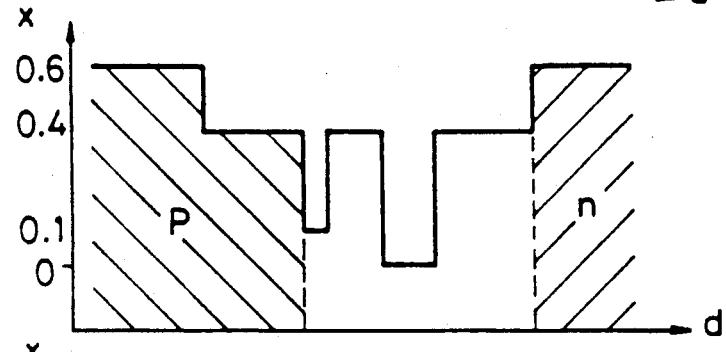
Figure 11C:
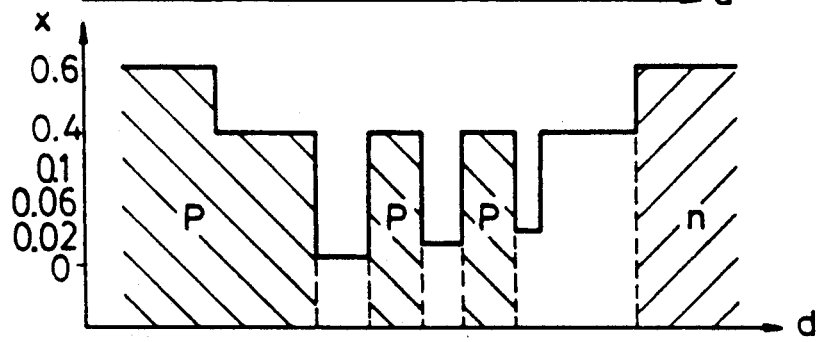
Figure 11D:
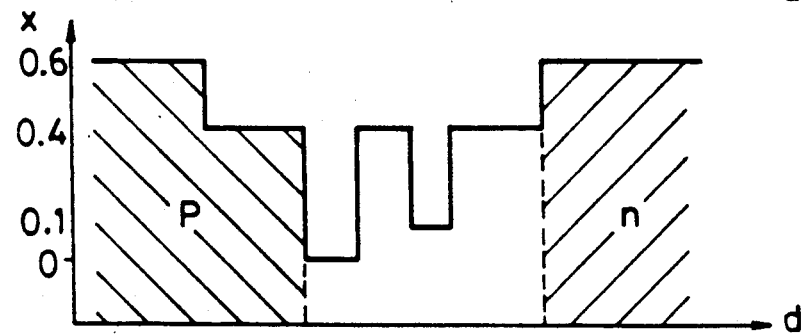
Figure 11E:
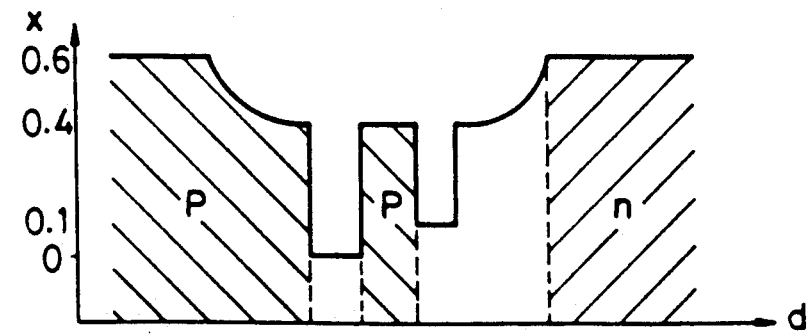

The arrangement of the active layer, which is one of the critical features of the present invention, can have various forms in addition to the form described in connection with FIGS. 9A to 9C. FIGS. 11A to 11E show different forms of the construction of the active layer. More specifically, a structure shown in FIG. 11A has a plurality of well layers of the same composition with different widths. In the structure shown in FIG. 11B, a well layer of a small energy gap is provided adjacent to the n-type intersurface. FIG. 11C shows a structure in which all of a plurality of well layers are of mixed crystal compositions. FIG. 11D shows a structure in which the barrier layer is not doped with p-type acceptor impurities. In FIG. 11E, the compositions of the electron/light contracting layer is progressively changed. All these structures are possible to cause a plurality of quantum well layers to emit light with threshold currents close to each other.

It will be clear that all the structures shown in FIGS. 11A to 11E may be modified such that the p- and n-type portions are replaced with each other. The advantages of the invention, i.e., easiness of emission of lights from a quantum well having high energy gap and reduction in the threshold value are attainable even with such modifications.

Embodiment 2

Figure 12:
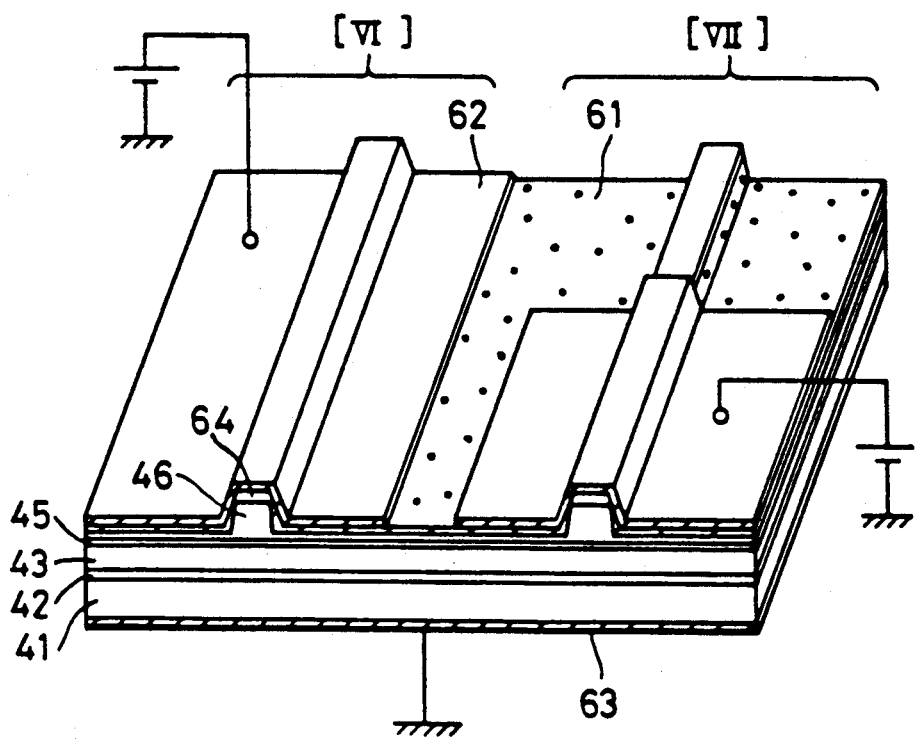
FIG. 12 is a perspective view of a fifth embodiment of the present invention.

FIG. 12 shows a multi-wavelength semiconductor laser device embodying the present invention. This embodiment has independent current injecting regions and are constructed in the form of an array so as to correspond to energy gaps of well layers of different emission wavelengths.

More specifically, this embodiment is a ridge-waveguide type laser which is divided into two regions in a direction perpendicular to the direction of resonance. The region [VI] are provided with electrodes over the entire areas of the resonator, whereas, in the region [VII] the resonator has a portion where electrode is not attached. As a result, in the region [VI], the whole portion of the resonator constitutes a gain region, whereas, in the region [VII], a part of the resonator constitutes a loss region while other portion serves as the gain region. In consequence, the loss in the resonator in the region [VII] is greater than that in the region [VI]. Consequently, the threshold current density is greater in the region [VII] than in the region [VI].

In the semiconductor laser device of the present invention, when the active layer is constituted by a plurality of quantum well layers having different energy gaps, the threshold gains of the emission wavelengths corresponding to respective energy gaps are in most cases different from each other. More specifically, the well layer having greater energy gap exhibits a greater value of the threshold gain.

Referring to FIG. 12, the emission from the well layer having greater energy gap is controlled by controlling the length of the electrode in the region [VII] in which the resonator has a portion devoid of the current injecting area, whereas the emission from the well layer having smaller energy gap is conducted by utilizing the region [VI], whereby a laser array capable of emitting lights of different wavelengths can be obtained.

This laser has the following layers formed in order by epitaxial growth on an n+-GaAs substrate 41: an n+-GaAs buffer layer 42; n-$Al_{0.5}Ga_{0.5}As$ cladding layer 43; an active layer 45; a p-$Al_{0.5}Ga_{0.5}As$ clad layer 46; and a p+-GaAs cap layer 64. After a mesa processing for contracting electrical current, an $SiO_2$ insulating layer 61 is formed by plasma CVD method. Then, a current injection window is formed in an upper portion of the ridge, followed by formation of an Au/Cr p-type electrode 62 by evaporation deposition.

The electrode 62 is then divided into portions which belong to the regions [VI] and [VII], respectively, and a portion of the electrode in the region [VII] is removed by etching so that the electrode covers only a portion of the resonator. Then, lapping is conducted followed by formation of an n-type Au-Ge/Au electrode by evaporation deposition.

The active layer in this embodiment has the same construction as that in the first embodiment. It was confirmed that the semiconductor laser device of the second embodiment can emit lights at wavelengths of 860 nm and 800 nm, respectively, when the length of the resonator in the region [VI] is 300 μm and the length over which the electrode is attached to the resonator in the region [VII] is 200 μm.

In the second embodiment as described, the well layer of the greater energy gap has a thickness smaller than that of the well layer having the smaller energy gap. This, however, is only illustrative and the arrangement may be such that the well layer having the greater energy gap is greater in thickness than the well layer having the smaller energy gap. Such an arrangement is shown in FIG. 13.

Figure 13:
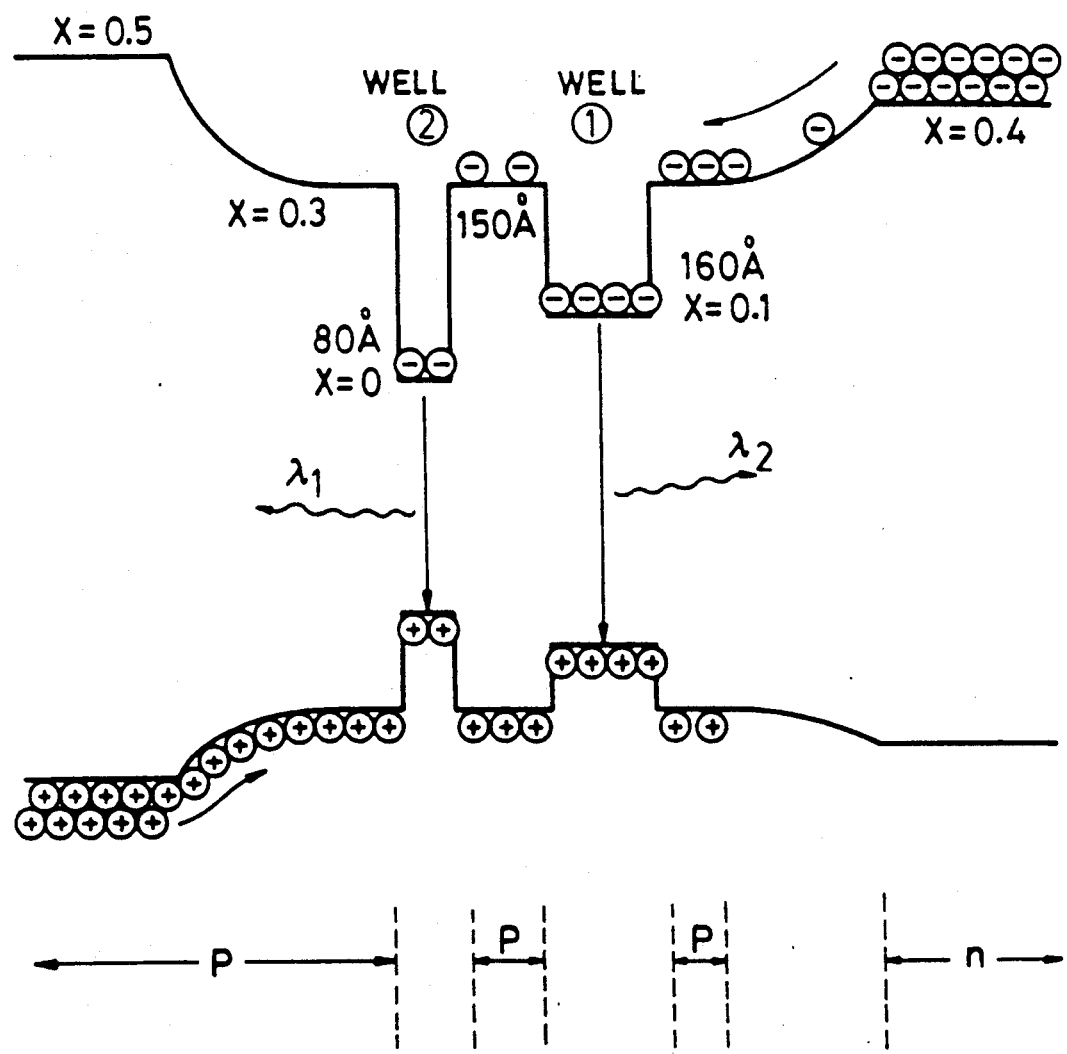
FIG. 13 is an illustration of a band in a modified quantum well structure in the fifth embodiment.

Referring to FIG. 13, the light waveguide structure has a plurality of quantum wells of different energy gaps, a barrier layer and SC layers. The thickness of the well layer having greater energy gap is determined to be not smaller than that of the well layer having smaller energy gap.

Embodiment 3

A semiconductor laser device was produced in the same manner as first embodiment except that the thicknesses of the first and second well layers 52 and 54 were determined to be 160 Å and 80 Å, respectively. The emission wavelengths at room temperature, corresponding to the energy levels of the first and second well layers, were 820 nm and 940 nm, respectively. The pitches of the diffraction gratings in the regions [IV] and [V] were respectively $\Gamma_1=2485$ and $\Gamma_2=2545$ Å.

The construction of the active layer shown in FIG. 13 is only illustrative and various other constructions can be adopted equally well.

FIGS. 14A to 14D show different forms of the active layers which can be used in place of the construction shown in FIG. 13.

Figure 14A:
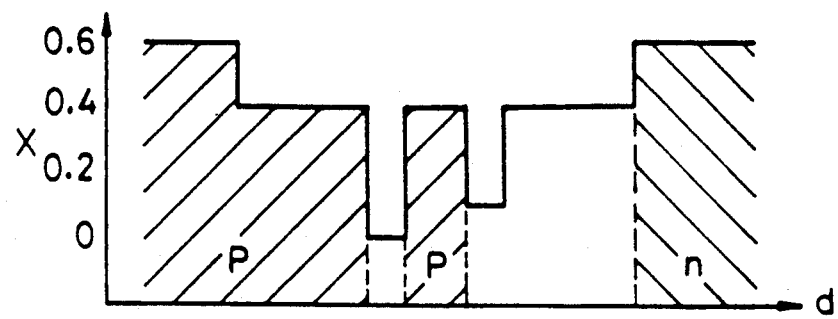
FIGS. 14A, 14B, 14C and 14D show different forms of the active layers which can be used in place of the construction shown in FIG. 13.
Figure 14B:
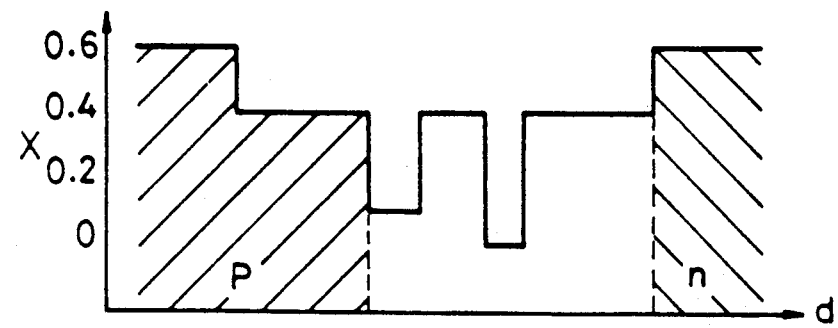
Figure 14C:
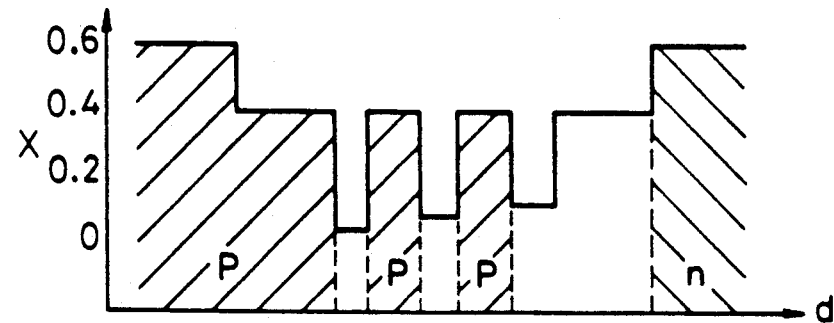
Figure 14D:
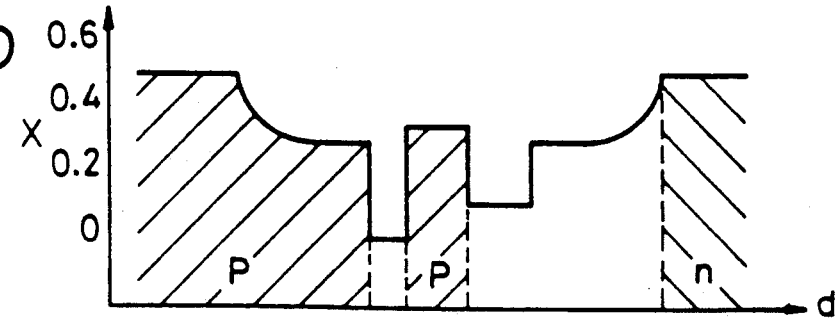

More specifically, a structure shown in FIG. 14A has a plurality of well layers of the different composition with the same widths. In the structure shown in FIG. 14B, a well layer of a small energy gap is provided adjacent to the n-type intersurface. FIG. 14C shows a structure in which all of a plurality of well layers are of mixed crystal compositions. In FIG. 14D, the compositions of the electron/light contracting layers are different than that of the barrier layer. All these structures are possible to cause a plurality of quantum well layers to emit light with threshold currents close to each other.

It will be clear that all the structure shown in FIG. 13 may be modified such that the p- and n-type portions are replaced with each other. The advantages of the invention, i.e., easiness of emission of lights from a quantum well having high energy gap and reduction in the threshold value are attainable even in such a modification.

Although preferred embodiments have been described, it is to be understood that the described embodiments are not exclusive and various changes and modifications maybe imparted thereto. For instance, although $Al_xGa_{1-x}As$ type semiconductors are used in the described embodiments, any other types of semiconductors capable of forming a hetero structure, e.g., InGaAs and AlGaInP semiconductors, can be used as the semiconductors, as will be clear to those skilled in the art. It is also to be understood that the ridge-type waveguide path structure used for contracting light and current maybe substituted by any other suitable structure which is used in ordinary semiconductor lasers. The structures for contracting light and current, as well as methods for forming such structures, are shown in issues in current 15 years of Applied Physics Letters and IEEE Journal of Quantum Electronics, so that detailed description is omitted.

It will be also clear that the number of the light-emitting layers may be three or more, although the semiconductor laser devices described have two light-emitting layers.

The laser device of the present invention also can be used as a photo-amplifier which can operate at high frequency over a wide range of wavelength. In such a case, electrical current is supplied to the semiconductor laser device at a level slightly lower than the threshold current which causes light emission. In this state, a light having a wavelength approximating that of the light emitted from the laser is made to be incident to the semiconductor laser device through one of the end surfaces thereof, while taking a light having the same wavelength as the incident light out of the device through the other end surface. As shown by the curve (c) in FIG. 5, the semiconductor laser device of the present invention exhibits a gain over a wavelength region which is substantially equivalent to that of the curve (b) showing the characteristic of a known device and greater than that in the curve (a) showing characteristic of another known device, with a current injection smaller than that in the case of the known device having the characteristic (b). It is therefore possible to obtain a photo-amplifier which can operate with a high efficiency over a wider wavelength region that conventional devices.

The semiconductor laser device of the present invention also can be used as a light wavelength converter which can operate at high efficiency over a wider wavelength region than known devices. In such a case, electrical current is injected to the semiconductor laser device at a level slightly smaller than the threshold current which causes laser emission. In this state, a light having a photon energy greater than the band gap of the light-emitting layer is incident to the device. As a result of application of the light, carriers are generated in the device so that a light having a wavelength different from that of the incident light is emitted from one end surface of the device. If the current injected to the device is close to the threshold current for the emission of light at the wavelength $\lambda_1$, the light emitted from the device has a wavelength equal to or close to the wavelength $\lambda_1$, whereas, when the injected current is close to the threshold current for emission at the wavelength $\lambda_2$, a light of a wavelength equal to or close to this wavelength $\lambda_2$ is emitted from the device. It is thus possible to obtain a light wavelength converter which can operate at a high efficiency over wider range of wavelength than known devices.

What is claimed is:

1. A semiconductor laser device comprising:
    a substrate;
    a first light-emitting layer provided on said substrate comprising a first resonant cavity;
    a second light-emitting layer provided on said substrate comprising a second resonant cavity and having a greater band gap than said first light-emitting layer;
    a barrier layer disposed between said first and second light-emitting layers and having a band gap greater than those of said first and second light-emitting layers, the band gap and the thickness of said barrier layer being determined to be large enough to create, in response to injection of carriers to said light-emitting layers, a state in which the carrier density in said second light-emitting layer is made higher while the carrier density in said first light-emitting layer is made lower than those which would be obtained when said barrier layer is omitted;
    a pair of cladding layers sandwiching therebetween said first light-emitting layer, said barrier layer and said second light-emitting layer, said cladding layers having smaller refractive index values than said first and second light-emitting layers; and
    an electrode means for supplying electrical currents to said first and second light-emitting layers.

2. A semiconductor laser device according to claim 1, wherein said device is constructed to meet the following condition:

$$\Gamma_1(\lambda_1)g1(\lambda_1, n_1, p_1) \approx \Gamma_2(\lambda_2)g2(\lambda_2, n_2, p_2)$$

where $n_1$ and $n_2$ represent electron densities in the first and second light-emitting layers, $p_1$, $p_2$ represent the hole densities in the first and second light-emitting layers, $\lambda_1$ and $\lambda_2$ represent the emission wavelengths of the first and second light-emitting layers; $g1(\lambda_1, n_1, p_1)$ and $g2(\lambda_2, n_2, p_2)$ represent the photo-gains of the first and second light-emitting layers, and $\Gamma_1(\lambda_1)$ and $\Gamma_2(\lambda_2)$ represent the light confinement coefficients of the first and second light-emitting layers, respectively.

3. A semiconductor laser device according to claim 1, wherein said barrier layer is doped with impurities so as to have as the same polarity as one of two types of carriers which encounters with greater resistance in reaching the light-emitting layer beyond said barrier layer when said two types of carriers are respectively injected from said cladding layers on both sides of said barrier layer.

4. A semiconductor laser device according to claim 1, further comprising a pair of separate confinement layers disposed between said cladding layers and adjacent light-emitting layers, said separate confinement layers having a band gap greater than those of said first and second light-emitting layers and smaller than those of said cladding layers.

5. A semiconductor laser device according to claim 4, wherein one of said separate confinement layers includes an n-type semiconductor while the other includes a p-type semiconductor, the portion of the n-type separate confinement layer adjacent to said light-emitting layer being doped with impurities to p-type.

6. A semiconductor laser device according to claim 4, wherein each said separate confinement layer exhibits a variation of the band gap such that the band gap progressively increases from the end of said separate confinement layer adjacent to said light-emitting layer towards the end of the same adjacent to the cladding layer.

7. A semiconductor laser device according to claim 1, wherein, when electrical current is supplied to said device at a level near a threshold level, said first light-emitting layer exhibits a positive photo-gain at the emission wavelengths of said second light-emitting layer.

8. A semiconductor laser device according to claim 1, wherein said electrode means includes a plurality of electrodes which are arranged in the direction of resonance of the laser, and wherein means are provided for independently controlling the electrical currents supplied to said electrodes.

9. A semiconductor laser device according to claim 8, wherein an inverse bias voltage is applied to one of said electrodes.

10. A semiconductor laser device according to claim 1, wherein said second light-emitting layer has a thickness greater than that of said first light-emitting layer.

11. A semiconductor laser device according to claim 1, wherein said second light-emitting layer has a thickness smaller than that of said first light-emitting layer.

12. A semiconductor laser device according to claim 1, wherein said substrate and said layers are made of GaAs or AlGaAs.

13. a method of driving a semiconductor laser device of the type having:
    a substrate;
    a first light-emitting layer provided on said substrate comprising a first resonant cavity;
    a second light-emitting layer provided on said substrate comprising a second resonant cavity and having a greater band gap than said first light-emitting layer;
    a barrier layer disposed between said first and second light-emitting layers and having a band gap greater than those of said first and second light-emitting layers, the band gap and the thickness of said barrier layer being determined to be large enough to create, in response to injection of carriers to said light-emitting layers, a state in which the carrier density in said second light-emitting layer is made higher while the carrier density in said first light-emitting layer is made lower than those which would be obtained when said barrier layer is omitted;

a pair of cladding layers sandwiching therebetween said first light-emitting layer, said barrier layer and said second light-emitting layer, said cladding layers having smaller refractive index values than said first and second light-emitting layers; and an electrode means for supplying electrical currents to said first and second light-emitting layers;

said method comprising the steps of:

injecting, through said electrode means, an electrical current of a level slightly lower than an emission threshold current of said laser;

causing an external light of a wavelength near the laser emission wavelength to be incident to said device; and taking a light of the same wavelength as the incident light out of said device.

14. A method of driving a semiconductor laser device of the type having:

a substrate;

a first light-emitting layer provided on said substrate comprising a first resonant cavity;

a second light-emitting layer provided on said substrate comprising a second resonant cavity and having a greater band gap than said first light-emitting layer;

a barrier layer disposed between said first and second light-emitting layers and having a band gap greater than those of said first and second light-emitting layers, the band gap and the thickness of said barrier layer being determined to be large enough to create, in response to injection of carriers to said light-emitting layers, a state in which the carrier density in said second light-emitting layer is made higher while the carrier density in said first light-emitting layer is made lower than those which would be obtained when said barrier layer is omitted;

a pair of cladding layers sandwiching therebetween said first light-emitting layer, said barrier layer and said second light-emitting layer, said cladding layers having smaller refractive index values than said first and second light-emitting layers; and an electrode means for supplying electrical currents to said first and second light-emitting layers;

said method comprising the steps of:

injecting, through said electrode means, an electrical current of a level slightly lower than an emission threshold current of said laser;

causing an external light of a light having a photon energy greater than the band gaps of said first and second light-emitting layers to be incident to said device; and taking a light of a wavelength different from that of the incident light out of said devices.

15. A semiconductor laser device comprising:

a substrate;

a first light-emitting layer provided on said substrate comprising a first resonant cavity;

a second light-emitting layer provided on said substrate comprising a second resonant cavity and having a greater band gap than said first light-emitting layer;

a barrier layer disposed between said first and second light-emitting layers and having a band gap greater than those of said first and second light-emitting layers;

a pair of separate confinement layers sandwiching therebetween said first light-emitting layer, said barrier layer and said second light-emitting layer, said separate confinement layers having band gaps greater than those of said first and second light-emitting layers but smaller than that of said barrier layer;

a pair of cladding layers sandwiching therebetween said separate confinement layers, said cladding layers having smaller refractive index values than said separate confinement lasers; and an electrode means for supplying electrical currents to said first and second light-emitting layers.

16. A semiconductor laser device according to claim 15, wherein said device is constructed to meet the following condition:

$$\Gamma_1(\lambda_1)g1(\lambda_1, n_1, p_1) \approx \Gamma_2(\lambda_2)g2(\lambda_2, n_2, p_2)$$

where $n_1$ and $n_2$ represent electron densities in the first and second light-emitting layers, $p_1$, $p_2$ represent the hole densities in the first and second light-emitting layers, $\lambda_1$ and $\lambda_2$ represent the emission wavelengths of the first and second light-emitting layers; $g1(\lambda_1, n_1, p_1)$ and $g2(\lambda_2, n_2, p_2)$ represent the photo-gains of the first and second light-emitting layers, and $\Gamma_1(\lambda_1)$ and $\Gamma_2(\lambda_2)$ represent the light confinement coefficients of the first and second light-emitting layers, respectively.

17. A semiconductor laser device according to claim 15, wherein said barrier layer is doped with impurities so as to have as the same polarity as one of two types of carriers which encounters with greater resistance in reaching the light-emitting layer beyond said barrier layer when said two types of carriers are respectively injected from said cladding layers on both sides of said barrier layer.

18. A semiconductor laser device according to claim 15, wherein one of said separate confinement layers includes an n-type semiconductor while the other includes a p-type semiconductor, the portion of the n-type separate confinement layer adjacent to said light-emitting layer being doped with impurities to p-type.

19. A semiconductor laser device according to claim 15, wherein each said separate confinement layer exhibits a variation of the band gap such that the band gap progressively increases from the end of said separate confinement layer adjacent to said light-emitting layer towards the end of the same adjacent to the cladding layer.

20. A semiconductor laser device according to claim 15, wherein, when electrical current is supplied to said device at a level near a threshold level, said first light-emitting layer exhibits a positive photo-gain at the emission wavelengths of said second light-emitting layer.

21. A semiconductor laser device according to claim 15, wherein said electrode mans includes a plurality of electrodes which are arranged in the direction of resonance of the laser, and wherein means are provided for independently controlling the electrical currents supplied to said electrodes.

22. A semiconductor laser device according to claim 21, wherein an inverse bias voltage is applied to one of said electrodes.

23. A semiconductor laser device according to claim 15, wherein said second light-emitting layer has a thickness greater than that of said first light-emitting layer.

24. A semiconductor laser device according to claim 15, wherein said second light-emitting layer has a thickness smaller than that of said first light-emitting layer.

25. A semiconductor laser device according to claim 15, wherein said substrate and said layers are made of GaAs or AlGaAs.

26. A method of driving a semiconductor laser device of the type having:
- a substrate;
- a first light-emitting layer provided on said substrate comprising a first resonant cavity;
- a second light-emitting layer provided on said substrate comprising a second resonant cavity and having a greater band gap than said first light-emitting layer;
- a barrier layer disposed between said first and second light-emitting layers and having a band gap greater than those of said first and second light-emitting layers;
- a pair of separate confinement layers sandwiching therebetween said first light-emitting layer, said barrier layer and said second light-emitting layer, said separate confinement layers having band gaps greater than those of said first and second light-emitting layers but smaller than that of said barrier layer;
- a pair of cladding layers sandwiching therebetween said separate confinement layers, said cladding layers having smaller refractive index values than said separate confinement lasers; and
- an electrode means for supplying electrical currents to said first and second light-emitting layers;

said method comprising the steps of:
- injecting, through said electrode means, an electrical current of a level slightly lower than an emission threshold current of said laser;
- causing an external light of a wavelength near the laser emission wavelength to be incident to said device; and
- taking a light of the same wavelength as the incident light out of said device.

27. A method of driving a semiconductor laser device of the type having:
- a substrate;
- a first light-emitting layer provided on said substrate comprising a first resonant cavity;
- a second light-emitting layer provided on said substrate comprising a second resonant cavity and having a greater band gap than said first light-emitting layer;
- a barrier layer disposed between said first and second light-emitting layers and having a band gap greater than those of said first and second light-emitting layers;
- a pair of separate confinement layers sandwiching therebetween said first light-emitting layer, said barrier layer and said second light-emitting layer, said separate confinement layers having band gaps greater than those of said first and second light-emitting layers but smaller than that of said barrier layer;
- a pair of cladding layers sandwiching therebetween said separate confinement layers, said cladding layers having smaller refractive index values than said separate confinement lasers; and
- an electrode means for supplying electrical currents to said first and second light-emitting layers;

said method comprising the steps of:
- injecting, through said electrode means, an electrical current of a level slightly lower than an emission threshold current of said laser;
- causing an external light of a light having a photon energy greater than the band gaps of said first and second light-emitting layers to be incident to said device; and
- taking a light of a wavelength different from that of the incident light out of said device.

28. A semiconductor laser array comprising:
(a) a first semiconductor laser including:
- a substrate;
- a first light-emitting layer provided on said substrate comprising a first resonant cavity;
- a second light-emitting layer provided on said substrate comprising a second resonant cavity and having a greater band gap than said first light-emitting layer;
- a barrier layer disposed between said first and second light-emitting layers and having a band gap greater than those of said first and second light-emitting layers, the band gap and the thickness of said barrier layer being determined to be large enough to create, in response to injection of carriers to said light-emitting layers, a state in which the carrier density in said second light-emitting layer is made higher while the carrier density in said first light-emitting layer is made lower than those which would be obtained when said barrier layer is omitted;
- a pair of cladding layers sandwiching therebetween said first light-emitting layer, said barrier layer and said second light-emitting layer, said cladding layers having smaller refractive index values than said first and second light-emitting layers; and
- an electrode means for supplying electrical currents to said first and second light-emitting layers;

(b) a second semiconductor laser device formed on the same substrate as said first semiconductor laser device in a monolithic manner and having the same construction as said first semiconductor laser device; and (c) said electrode means of the first and second semiconductor laser devices having different lengths from each other in the direction of the laser resonance.

29. A semiconductor laser array according to claim 28, wherein the following condition is met:

$$\Gamma_1(\lambda_1)g1(\lambda_1, n_1, p_1) \approx \Gamma_2(\lambda_2) g2(\lambda_2, n_1, p_1)$$

where, $n_1$ and $N_2$ represent electron densities in the first and second light-emitting layers, $p_1$, $p_2$ represent the hole densities in the first and second light-emitting layers, $\lambda_1$ and $\lambda_2$ represent the emission wavelengths of the first and second light-emitting layers, $g1(\lambda_1, n_1, p_1)$ and $g2(\lambda_2, n_2, p_2)$ represent the photo-gains of the first and second light-emitting layers, and $\Gamma_1(\lambda_1)$ and $\Gamma_2(\lambda_2)$ represent the light confinement coefficients of the first and second light-emitting layers, respectively.

30. A semiconductor laser array according to claim 28, wherein said barrier layer is doped with impurities so as to have as the same polarity as one of two types of carriers which encounters with greater resistance in reaching the light-emitting layer beyond said barrier layer when said two types of carriers are respectively injected from said cladding layers on both sides of said barrier layer.

31. A semiconductor laser array according to claim 28, further comprising a pair of separate confinement layers disposed between said cladding layers and adjacent light-emitting layers, said separate confinement layers having a band gap greater than those of said first and second light-emitting layers and smaller than those of said cladding layers.

32. A semiconductor laser array according to claim 28, wherein entire portion of one of said separate confinement layers and a portion of the other separate confinement layer adjacent to the light-emitting layer are doped with impurities to p-type.

33. A semiconductor laser array according to claim 31, wherein each said separate confinement layer exhibits a variation of the band gap such that the band gap progressively increases from the end of said separate confinement layer adjacent to said light-emitting layer towards the end of the same adjacent to the cladding layer.

34. A semiconductor laser array according to claim 28, wherein, when electrical current is supplied to said device at a level near a threshold level, said first light-emitting layer exhibits a positive photo-gain at the emission wavelengths of said second light-emitting layer.

35. A semiconductor laser array according to claim 28, wherein said second light-emitting layer has a thickness greater than that of said first light-emitting layer.

36. A semiconductor laser array according to claim 28, wherein said second light-emitting layer has a thickness smaller than that of said first light-emitting layer.

37. A semiconductor laser array according to claim 28, wherein said substrate and said layers are made of GaAs or AlGaAs.

38. A semiconductor laser array comprising:
(a) a first semiconductor laser including:
  a substrate;
  a first light-emitting layer provided on said substrate comprising a first resonant cavity;
  a second light-emitting layer provided on said substrate comprising a second resonant cavity and having a greater band gap than said first light-emitting layer;
  a barrier layer disposed between said first and second light-emitting layers and having a band gap greater than those of said first and second light-emitting layers, the band gap and the thickness of said barrier layer being determined to be large enough to create, in response to injection of carriers to said light-emitting layers, a state in which the carrier density in said second light-emitting layer is made higher while the carrier density in said first light-emitting layer is made lower than those which would be obtained when said barrier layer is omitted;
  a pair of cladding layers sandwiching therebetween said first light-emitting layer, said barrier layer and said second light-emitting layer, said cladding layers having smaller refractive index values than said first and second light-emitting layers; and
  an electrode means for supplying electrical currents to said first and second light-emitting layers;
(b) a second semiconductor laser device formed on the same substrate as said first semiconductor laser device in a monolithic manner and having the same construction as said first semiconductor laser device; and
(c) first and second diffraction gratings provided in said first and second semiconductor laser devices, respectively, said first and second diffraction gratings having different pitches from each other.

39. A semiconductor laser array according to claim 38, wherein the pitches $\Lambda_1$ and $\Lambda_2$ of said first and second diffraction gratings are determined to meet the following conditions:

$$\Lambda_1 = l \cdot \lambda_1 / 2 n_{\mathit{eff}(1)}$$

$$\Lambda_2 = l \cdot \lambda_2 / 2 n_{\mathit{eff}(2)}$$

where, $\lambda_1$ and $\lambda_2$ represent the wavelengths of lights emitted from said first and second light-emitting layers, $n_{\mathit{eff}(1)}$ and $n_{\mathit{eff}(2)}$ represent the equivalent refractive index values of the light waveguide portions of said first and second semiconductor laser devices, and l represents the number of order of diffraction.

40. A semiconductor laser array according to claim 38, wherein the following condition is met:

$$\Gamma_1(\lambda_1) g1(\lambda_1, n_1, p_1) \approx \Gamma_2(\lambda_2) g2(\lambda_2, n_2, p_2)$$

where, $n_1$ and $n_2$ represent electron densities in the first and second light-emitting layers, $p_1$, $p_2$ represent the hole densities in the first and second light-emitting layers, $\lambda_1$ and $\lambda_2$ represent the emission wavelengths of the first and second light-emitting layers; $g1(\lambda_1, n_1, p_1)$ and $g2(\lambda_2, n_2, p_2)$ represent the photo-gains of the first and second light-emitting layers, and $\Gamma_1(\lambda_1)$ and $\Gamma_2(\lambda_2)$ represent the light confinement coefficients of the first and second light-emitting layers, respectively.

41. A semiconductor laser array according to claim 38, wherein said barrier layer is doped with impurities so as to have as the same polarity as one of two type of carriers which encounters with greater resistance in reaching the light-emitting layer beyond said barrier layer when said two types of carriers are respectively injected from said cladding layers on both sides of said barrier layer.

42. A semiconductor laser array according to claim 38, further comprising a pair of separate confinement layers disposed between said cladding layers and adjacent light-emitting layers, said separate confinement layers having a band gap greater than those of said first and second light-emitting layers and smaller than those of said cladding layers.

43. A semiconductor laser array according to claim 42, wherein entire portion of one of said separate confinement layers and a portion of the other separate confinement layer adjacent to said light emitting layer are doped with impurities to p-type.

44. A semiconductor laser array according to claim 42, wherein each said separate confinement layer exhibits a variation of the band gap such that the band gap progressively increases from the end of said separate confinement layer adjacent to said light-emitting layer towards the end of the same adjacent to the cladding layer.

45. A semiconductor laser array according to claim 38, wherein, when electrical current is supplied to said device at a level near a threshold level, said first light-emitting layer exhibits a positive photo-gain at the emission wavelengths of said second light-emitting layer.

46. A semiconductor laser array according to claim 38, wherein said second light-emitting layer has a thickness greater than that of said first light-emitting layer.

47. A semiconductor laser array according to claim 38, wherein said second light-emitting layer has a thickness smaller than that of said first light-emitting layer.

48. A semiconductor laser array according to claim 38, wherein said substrate and said layers are made of GaAs or AlGaAs.

* * * * *

UNITED STATES PATENT AND TRADEMARK OFFICE
CERTIFICATE OF CORRECTION

PATENT NO. : 5,033,053
DATED : July 16, 1991
INVENTOR(S) : AKIRA SHIMIZU ET AL.     Page 1 of 4

It is certified that error appears in the above-identified patent and that said Letters Patent is hereby corrected as shown below:

Title Page:

AT [30] FOREIGN APPLICATION PRIORITY DATA

"Mar. 31, 1989 [JP]  Japan..........1-078716" should read
--Mar. 31, 1989 [JP]  Japan..........1-078176--.

AT [56] REFERENCES CITED

Foreign Patent Documents,
    "199583 11/1983 Japan" should be deleted.
Attorney, Agent or Firm,
    "Fatzpatrick, Cella, Harper & Scinto" should read
    --Fitzpatrick, Cella, Harper & Scinto--.

COLUMN 1

Line 34, "medium," should read --reproducing beam,--.

COLUMN 3

Line 32, "means" should read --to mean--.
Line 49, "is" should read --are--.
Line 59, "is" should read --are--.
Line 63, "grater" should read --greater--.

COLUMN 4

Line 20, "encounters" should read --encounter--.
Line 26, "that" should read --as that--.
Line 46, "operated" should read --operates--.

UNITED STATES PATENT AND TRADEMARK OFFICE
CERTIFICATE OF CORRECTION

PATENT NO. : 5,033,053
DATED : July 16, 1991
INVENTOR(S) : AKIRA SHIMIZU ET AL.

It is certified that error appears in the above-identified patent and that said Letters Patent is hereby corrected as shown below:

COLUMN 5

Line 48, "o" should read --of--.
    Line 53, "is etched" should be deleted.
    Line 65, "Numeral" should read --Numerals--.

COLUMN 6

Line 13, "flowing" should read --flow--.
    Line 15, "encounters" should read --encounter--.
    Line 21, "p type" should read --p-type--.
    Line 35, "p and n types" should read --p- and n-types--.
    Line 44, "to" should read --too--.
    Line 56, "FIG." should read --FIGS.--.

COLUMN 7

Line 29, "given" should read --be given--.
    Line 57, "omitted." should read --emitted.--.

COLUMN 8

Line 17, "tie" should read --time--.
    Line 22, "be" should read --should be--.
    Line 32, "as" should read --the same as--.

COLUMN 9

Line 31, "claddinq" should read --cladding--.
    Line 49, "iS" should read --is--.

UNITED STATES PATENT AND TRADEMARK OFFICE
CERTIFICATE OF CORRECTION

PATENT NO. : 5,033,053
DATED : July 16, 1991
INVENTOR(S) : AKIRA SHIMIZU ET AL.

It is certified that error appears in the above-identified patent and that said Letters Patent is hereby corrected as shown below:

COLUMN 10

Line 4, "are" should read --is--.
Line 31, "$\mathbf{\Lambda}i$" should read --$\mathbf{\Lambda}_i$--.
Line 65, "μm)" should read --μm--.

COLUMN 11

Line 14, "p-Al$_{0.5}$Ga0.5As" should read --p-Al$_{0.5}$Ga$_{0.5}$As--.

COLUMN 12

Line 33, "compositions" should read --composition--.
Line 50, "are" should read --is--.
Line 56, "are" should read --is--.
Line 57, "areas" should read --area--.

COLUMN 13

Line 18, "clad" should read --cladding--.
Line 65, "$\Gamma_1=2485$" should read --$\Gamma_1=2485$ Å--.

COLUMN 14

Line 5, "composition" should read --compositions--.
Line 6, "widths." should read --width.--.
Line 25, "maybe" should read --may be--.
Line 33, "maybe" should read --may be--.
Line 65, "that" should read --than--.

COLUMN 15

Line 66, "as" (1st occurrence) should be deleted.

UNITED STATES PATENT AND TRADEMARK OFFICE
CERTIFICATE OF CORRECTION

PATENT NO. : 5,033,053
DATED : July 16, 1991
INVENTOR(S) : AKIRA SHIMIZU ET AL.

Page 4 of 4

It is certified that error appears in the above-identified patent and that said Letters Patent is hereby corrected as shown below:

COLUMN 18

Line 29, "as" (2nd occurrence) should be deleted.
Line 55, "mans" should read --means--.

COLUMN 19

Line 27, "lasers;" should read --layers;--.
Line 62, "lasers;" should read --layers;--.

COLUMN 20

Line 52, "$N_2$" should read --$n_2$--.
Line 63, "as" (2nd occurrence) should be deleted.

COLUMN 22

Line 38, "as" (2nd occurrence) should be deleted and "type" should read --types--.

Signed and Sealed this

Nineteenth Day of July, 1994

Attest:

BRUCE LEHMAN

*Attesting Officer*     *Commissioner of Patents and Trademarks*